United States Patent
Liu et al.

(10) Patent No.: US 11,456,383 B2
(45) Date of Patent: Sep. 27, 2022

(54) SEMICONDUCTOR DEVICE HAVING A CONTACT PLUG WITH AN AIR GAP SPACER

(71) Applicant: Taiwan Semiconductor Manufacturing Company, Ltd., Hsinchu (TW)

(72) Inventors: Su-Hao Liu, Jhongpu Township (TW); Kuo-Ju Chen, Taichung (TW); Kai-Hsuan Lee, Hsinchu (TW); I-Hsieh Wong, Hsinchu (TW); Cheng-Yu Yang, Xihu Township (TW); Liang-Yin Chen, Hsinchu (TW); Huicheng Chang, Tainan (TW); Yee-Chia Yeo, Hsinchu (TW); Syun-Ming Jang, Hsinchu (TW); Meng-Han Chou, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/879,894

(22) Filed: May 21, 2020

(65) Prior Publication Data
US 2021/0066500 A1  Mar. 4, 2021

Related U.S. Application Data

(60) Provisional application No. 62/894,006, filed on Aug. 30, 2019.

(51) Int. Cl.
*H01L 29/78* (2006.01)
*H01L 29/08* (2006.01)
(Continued)

(52) U.S. Cl.
CPC ........ *H01L 29/7851* (2013.01); *H01L 21/266* (2013.01); *H01L 21/31155* (2013.01);
(Continued)

(58) Field of Classification Search
CPC ..... H01L 21/823431; H01L 21/823821; H01L 21/845; H01L 27/0886; H01L 27/0924;
(Continued)

(56) References Cited

U.S. PATENT DOCUMENTS 9,105,490 B2   8/2015   Wang et al.
9,236,267 B2   1/2016   De et al.
(Continued)

FOREIGN PATENT DOCUMENTS

CN   110098175 A   8/2019
KR   20160122909 A   10/2016
(Continued)

*Primary Examiner* — Younes Boulghassoul
(74) *Attorney, Agent, or Firm* — Slater Matsil, LLP

(57) ABSTRACT

A device includes a fin extending from a semiconductor substrate; a gate stack over the fin; a first spacer on a sidewall of the gate stack; a source/drain region in the fin adjacent the first spacer; an inter-layer dielectric layer (ILD) extending over the gate stack, the first spacer, and the source/drain region, the ILD having a first portion and a second portion, wherein the second portion of the ILD is closer to the gate stack than the first portion of the ILD; a contact plug extending through the ILD and contacting the source/drain region; a second spacer on a sidewall of the contact plug; and an air gap between the first spacer and the second spacer, wherein the first portion of the ILD extends across the air gap and physically contacts the second spacer, wherein the first portion of the ILD seals the air gap.

20 Claims, 36 Drawing Sheets

(51) Int. Cl.
| | |
|---|---|
| *H01L 29/417* | (2006.01) |
| *H01L 29/66* | (2006.01) |
| *H01L 29/49* | (2006.01) |
| *H01L 21/3115* | (2006.01) |
| *H01L 21/266* | (2006.01) |
| *H01L 21/8238* | (2006.01) |
| *H01L 21/764* | (2006.01) |
| *H01L 21/768* | (2006.01) |
| *H01L 21/762* | (2006.01) |
| *H01L 21/285* | (2006.01) |

(52) U.S. Cl.
CPC ........ *H01L 21/764* (2013.01); *H01L 21/7682* (2013.01); *H01L 21/76825* (2013.01); *H01L 21/76831* (2013.01); *H01L 21/76897* (2013.01); *H01L 21/823821* (2013.01); *H01L 21/823828* (2013.01); *H01L 21/823864* (2013.01); *H01L 21/823871* (2013.01); *H01L 29/0847* (2013.01); *H01L 29/41725* (2013.01); *H01L 29/41766* (2013.01); *H01L 29/41791* (2013.01); *H01L 29/4991* (2013.01); *H01L 29/6653* (2013.01); *H01L 29/66545* (2013.01); *H01L 29/66795* (2013.01); *H01L 29/785* (2013.01); *H01L 21/28518* (2013.01); *H01L 21/76224* (2013.01); *H01L 21/76843* (2013.01); *H01L 21/76855* (2013.01); *H01L 2221/1063* (2013.01)

(58) Field of Classification Search
CPC ........... H01L 27/1211; H01L 27/10826; H01L 27/10879; H01L 29/41791; H01L 29/66795–66818; H01L 29/785–7856; H01L 2029/7857–7858; H01L 2924/13067; H01L 21/764; H01L 21/7682; H01L 29/4991; H01L 29/0649–0653; H01L 29/515; H01L 23/5222; H01L 21/3115–31155; H01L 21/76825; H01L 21/76859; H01L 29/6653; H01L 2221/1042–1047; H01L 21/266; H01L 21/823468; H01L 21/823864; H01L 29/6656; H01L 21/76829; H01L 21/76831; H01L 2221/1063; H01L 21/76897; H01L 21/823475; H01L 21/823871; H01L 21/28525; H01L 21/76805; H01L 21/76843; H01L 29/41725; H01L 29/41766; H01L 23/5283
See application file for complete search history.

(56) References Cited

U.S. PATENT DOCUMENTS

| | | | |
|---|---|---|---|
| 9,236,300 B2 | 1/2016 | Liaw | |
| 9,406,804 B2 | 8/2016 | Huang et al. | |
| 9,443,769 B2 | 9/2016 | Wang et al. | |
| 9,520,482 B1 | 12/2016 | Chang et al. | |
| 9,548,366 B1 | 1/2017 | Ho et al. | |
| 9,576,814 B2 | 2/2017 | Wu et al. | |
| 9,627,514 B1 | 4/2017 | Kim | |
| 9,831,183 B2 | 11/2017 | Lin et al. | |
| 9,859,386 B2 | 1/2018 | Ho et al. | |
| 10,164,053 B1 | 12/2018 | Chung et al. | |
| 11,094,796 B2* | 8/2021 | Yang | H01L 29/66795 |
| 2013/0248950 A1* | 9/2013 | Kang | H01L 29/4991 |
| | | | 257/288 |
| 2015/0243544 A1* | 8/2015 | Alptekin | H01L 29/6653 |
| | | | 438/586 |
| 2016/0163816 A1* | 6/2016 | Yu | H01L 29/785 |
| | | | 438/283 |
| 2016/0225667 A1* | 8/2016 | Zang | H01L 29/4991 |
| 2016/0308008 A1 | 10/2016 | Yeo et al. | |
| 2016/0365426 A1* | 12/2016 | Ching | H01L 29/6656 |
| 2017/0069726 A1* | 3/2017 | Kye | H01L 27/10894 |
| 2017/0084714 A1* | 3/2017 | Ching | H01L 29/785 |
| 2017/0179241 A1* | 6/2017 | Chang | H01L 29/41775 |
| 2018/0138280 A1* | 5/2018 | Li | H01L 29/66545 |
| 2018/0166553 A1* | 6/2018 | Lee | H01L 29/4983 |
| 2018/0182845 A1 | 6/2018 | Seong et al. | |
| 2018/0204927 A1 | 7/2018 | Chanemougame et al. | |
| 2019/0043959 A1* | 2/2019 | Lee | H01L 29/66545 |
| 2019/0148226 A1 | 5/2019 | Yim et al. | |
| 2019/0172752 A1* | 6/2019 | Hsu | H01L 29/66795 |
| 2019/0334025 A1* | 10/2019 | Chen | H01L 29/4991 |
| 2019/0385896 A1* | 12/2019 | Chiang | H01L 23/5226 |
| 2020/0020567 A1* | 1/2020 | Sun | H01L 21/266 |
| 2020/0105909 A1* | 4/2020 | Wu | H01L 29/7843 |
| 2020/0127110 A1* | 4/2020 | Lee | H01L 29/0649 |
| 2020/0219989 A1* | 7/2020 | Cheng | H01L 29/515 |
| 2021/0050412 A1* | 2/2021 | Wong | H01L 21/76843 |
| 2021/0083114 A1* | 3/2021 | Wang | H01L 21/76834 |

FOREIGN PATENT DOCUMENTS

| | | |
|---|---|---|
| KR | 20170077765 A | 7/2017 |
| KR | 20180073789 A | 7/2018 |
| KR | 20190013342 A | 2/2019 |
| KR | 20190024529 A | 3/2019 |
| KR | 20190056163 A | 5/2019 |
| TW | 201834079 A | 9/2018 |
| TW | 201841303 A | 11/2018 |
| TW | I677019 B | 11/2019 |

* cited by examiner

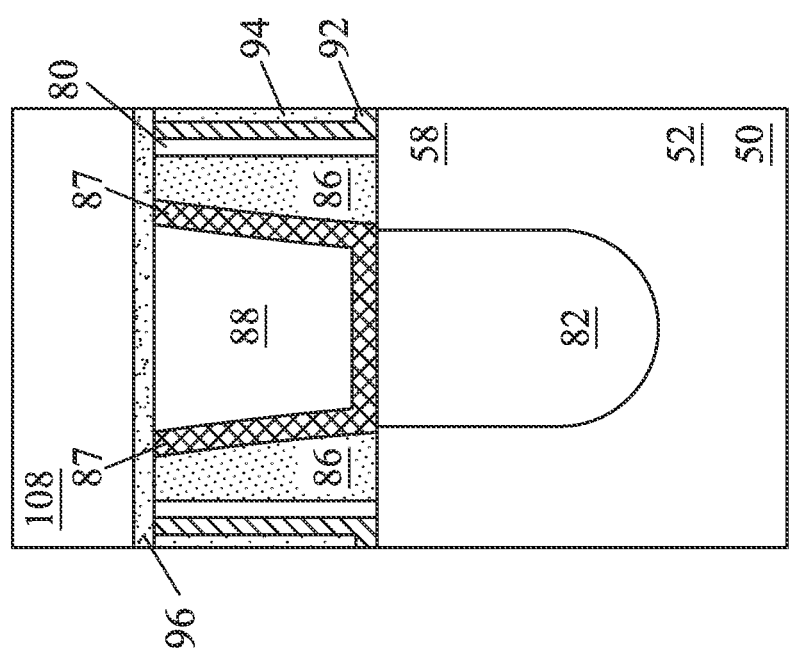

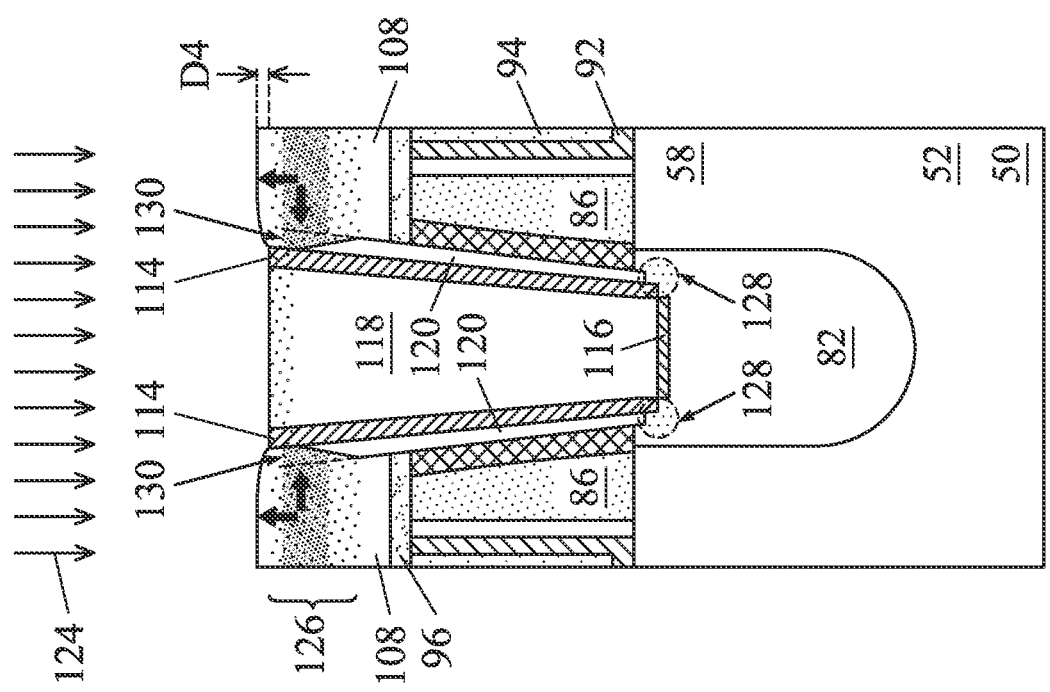

SEMICONDUCTOR DEVICE HAVING A CONTACT PLUG WITH AN AIR GAP SPACER

PRIORITY CLAIM AND CROSS-REFERENCE

This application claims the benefit of U.S. Provisional Application No. 62/894,006, filed on Aug. 30, 2019, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 16, 17, 18, 19, 20, 21, 22, and 23 are cross-sectional views of intermediate stages in the manufacturing of FinFETs having air gaps, in accordance with some embodiments.

FIGS. 26, 27A, 27B, and 28 are cross-sectional views of intermediate stages in the manufacturing of FinFETs having air gaps, in accordance with some embodiments.

DETAILED DESCRIPTION

Figure 1:
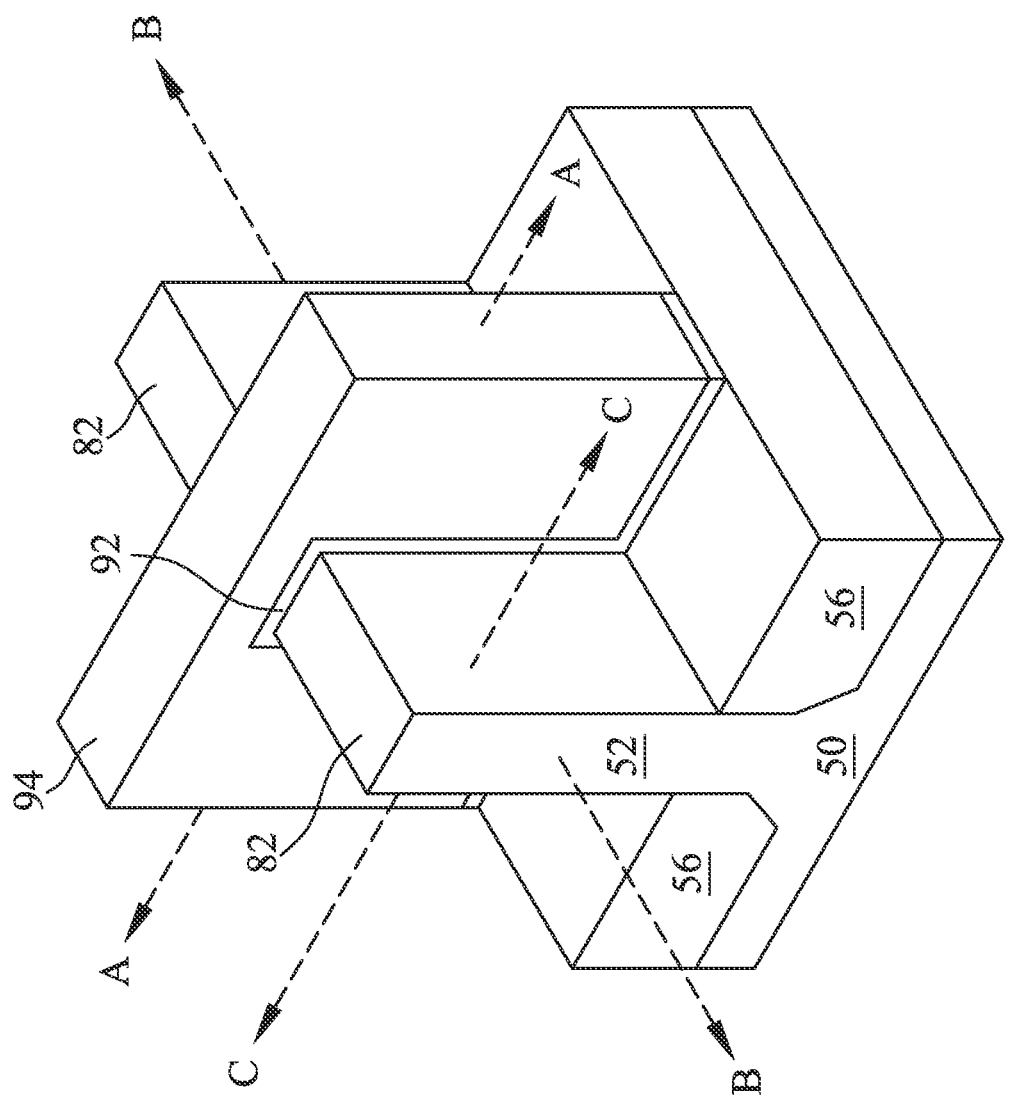
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, air gaps are formed surrounding contacts to the source/drain epitaxial regions of a FinFET device. The low dielectric constant (k-value) of the air gaps can reduce capacitance between the gate stack and the contacts of the FinFET device, which can improve higher speed (e.g., "AC") operation of the FinFET. In some embodiments, an implantation process is performed to implant dopants within an adjacent interlayer dielectric (ILD) layer, causing the ILD layer to expand and seal upper regions of the air gaps. In some embodiments, the presence of an additional dielectric layer (e.g., an etch stop layer) over the ILD layer during implantation can cause more lateral expansion of the ILD layer and less vertical expansion of the ILD layer. By sealing the air gaps, the chance of subsequently deposited conductive material entering the air gaps is reduced or eliminated. Accordingly, the chance of forming electrical shorts due to the presence of conductive material within the air gaps is reduced or eliminated.

FIG. 1 illustrates an example of a FinFET in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric layer 92 is along sidewalls and over a top surface of the fin 52, and a gate electrode 94 is over the gate dielectric layer 92. Source/drain regions 82 are disposed in opposite sides of the fin 52 with respect to the gate dielectric layer 92 and gate electrode 94. FIG. 1 further illustrates reference cross-sections that are used in later figures. Cross-section A-A is along a longitudinal axis of the gate electrode 94 and in a direction, for example, perpendicular to the direction of current flow between the source/drain regions 82 of the FinFET. Cross-section B-B is perpendicular to cross-section A-A and is along a longitudinal axis of the fin 52 and in a direction of, for example, a current flow between the source/drain regions 82 of the FinFET. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

FIGS. 2 through 33B include cross-sectional views of intermediate stages in the manufacturing of FinFETs, in accordance with some embodiments. FIGS. 2 through 7 illustrate reference cross-section A-A illustrated in FIG. 1, except for multiple fins/FinFETs. FIGS. 8A, 9A, 10A, 11A, 12A, 13A, 14A, 15A, 30A, 31A, 32A, and 33A are illustrated along reference cross-section A-A illustrated in FIG. 1, and FIGS. 8B, 9B, 10B, 11B, 12B, 13B, 14B, 14C, 15B, 16, 17, 18, 19, 21, 22, 23, 26, 27A, 27B, 28, 30B, 31B, 32B, and 33B are illustrated along a similar cross-section B-B illustrated in FIG. 1, except for multiple fins/FinFETs. FIGS. 10C and 10D are illustrated along reference cross-section C-C illustrated in FIG. 1, except for multiple fins/FinFETs.

Figure 2:
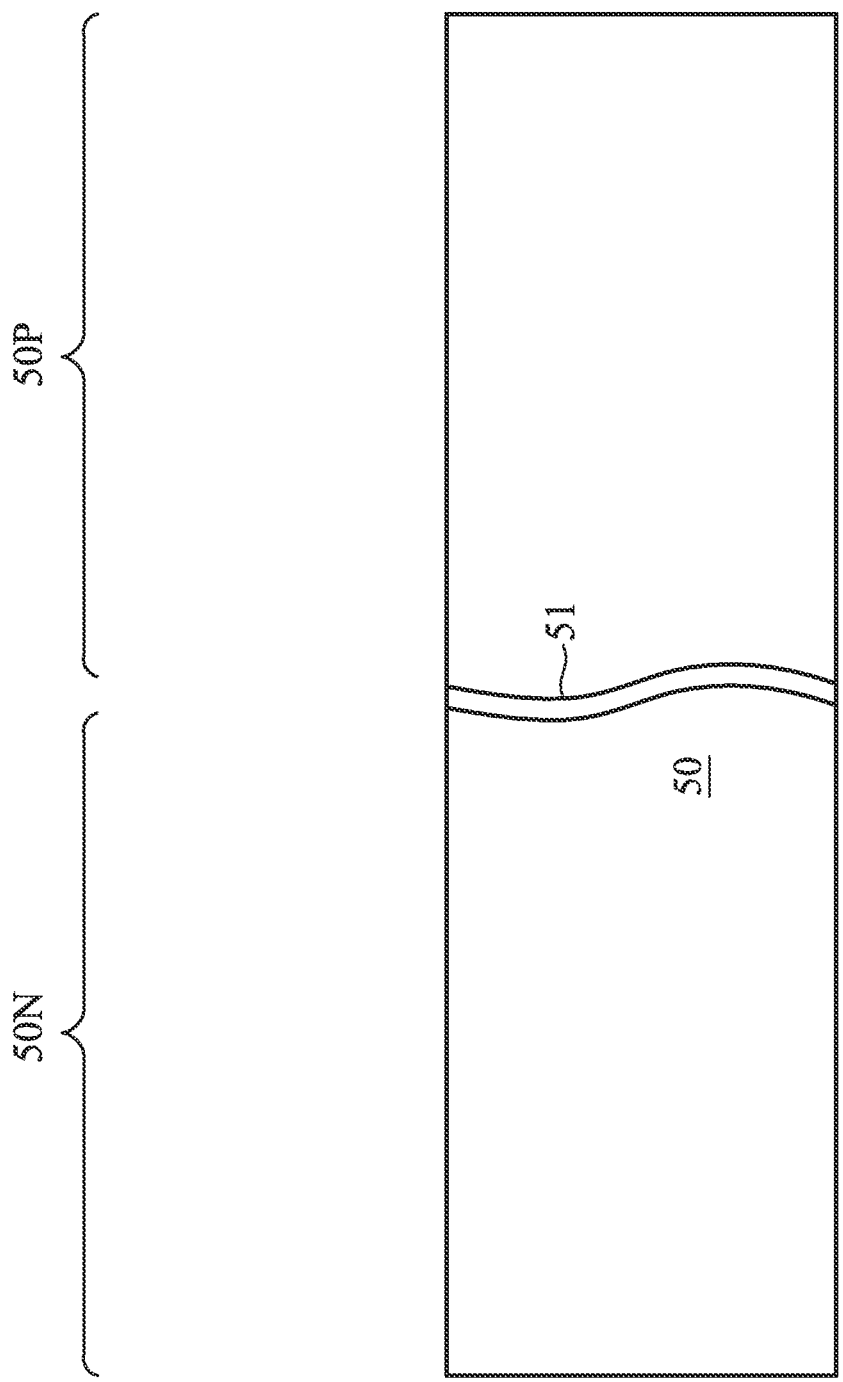
FIGS. 2, 3, 4, 5, 6, 7, 8A, 8B, 9A, 9B, 10A, 10B, 10C, 10D, 11A, 11B, 12A, 12B, 13A, 13B, 14A, 14B, 14C, 15A, and 15B are cross-sectional views of intermediate stages in the manufacturing of FinFETs, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has a region 50N and a region 50P. The region 50N can be for forming n-type devices, such as NMOS transistors, e.g., n-type FinFETs. The region 50P can be for forming p-type devices, such as PMOS transistors, e.g., p-type FinFETs. The region 50N may be physically separated from the region 50P (as illustrated by divider 51), and any number of device features (e.g., other active devices, doped regions, isolation structures, etc.) may be disposed between the region 50N and the region 50P.

Figure 3:
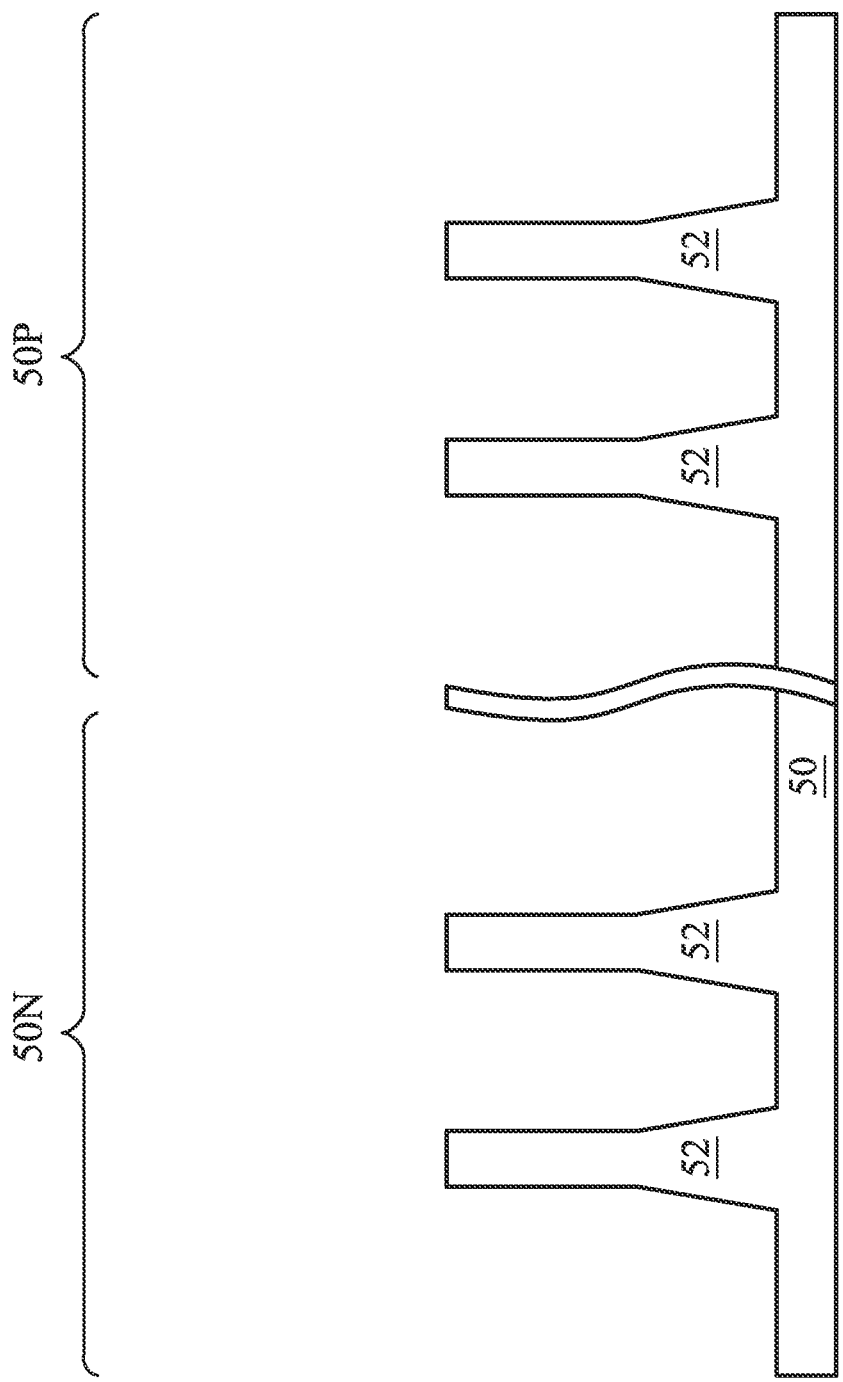

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (or other layer) may remain on the fins 52.

Figure 4:
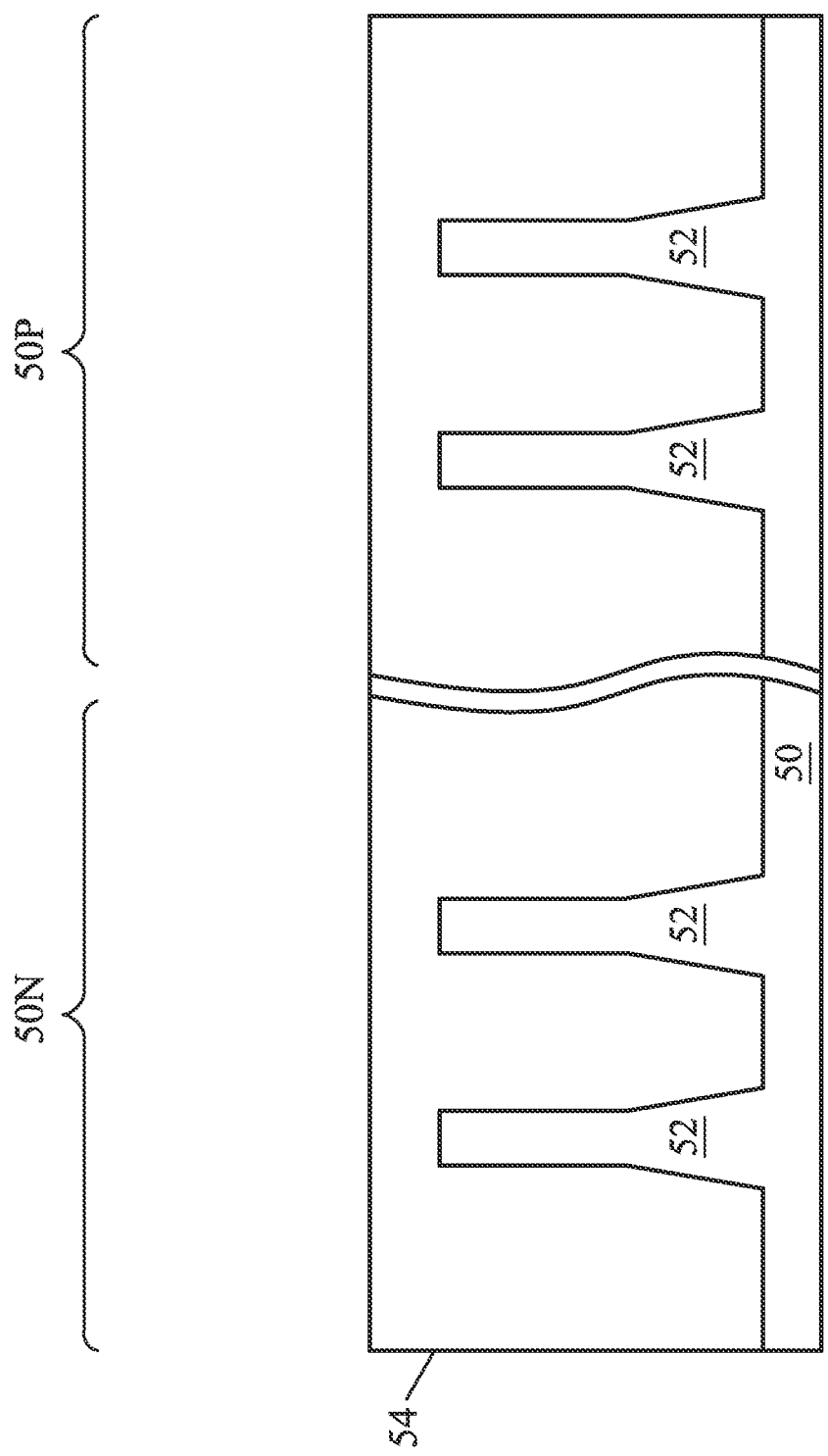

In FIG. 4, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52. Although the insulation material 54 is illustrated as a single layer, some embodiments may utilize multiple layers. For example, in some embodiments a liner (not shown) may first be formed along a surface of the substrate 50 and the fins 52. Thereafter, a fill material, such as those discussed above may be formed over the liner.

Figure 5:
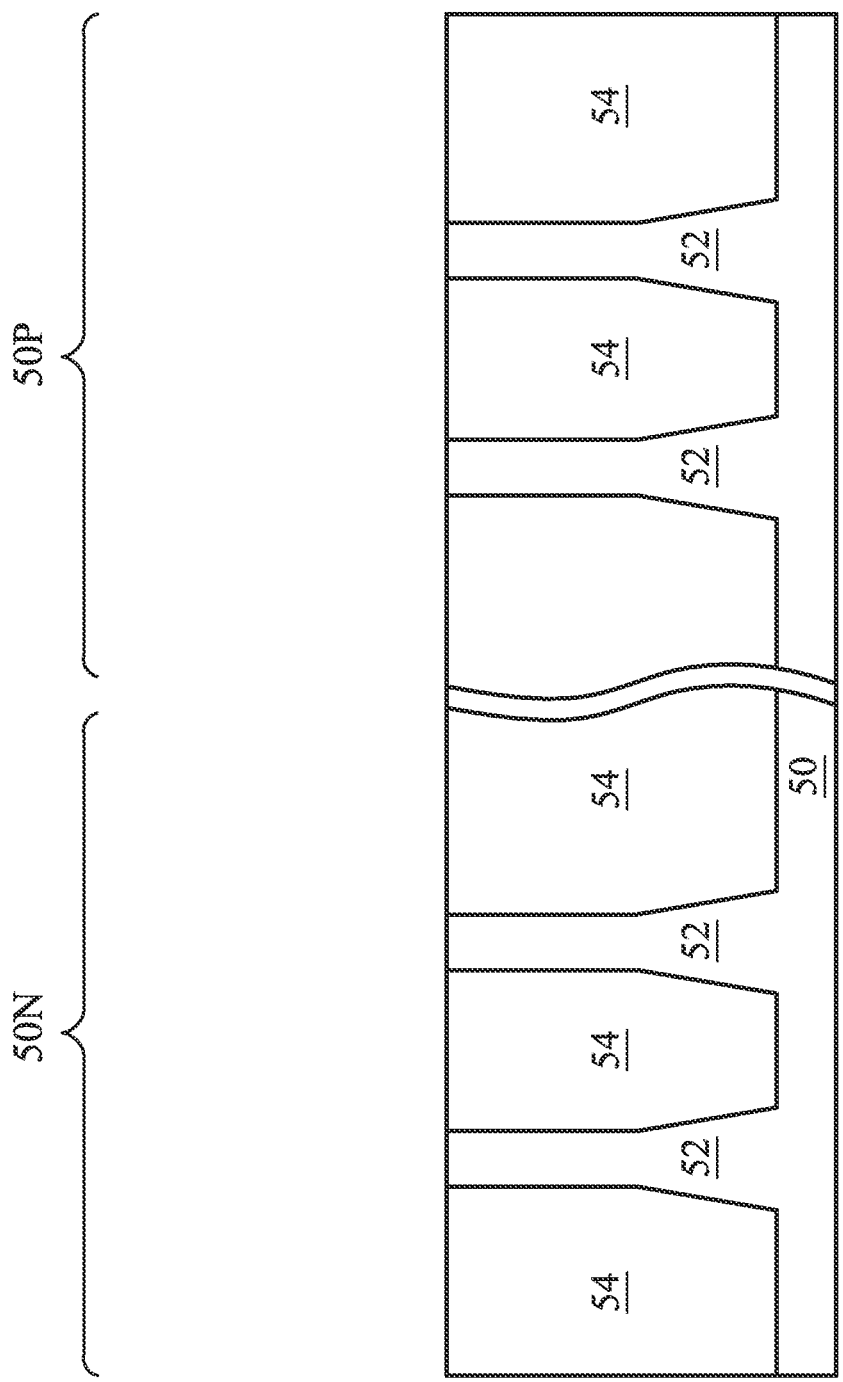

In FIG. 5, a removal process is applied to the insulation material 54 to remove excess insulation material 54 over the fins 52. In some embodiments, a planarization process such as a chemical mechanical polish (CMP), an etch-back process, combinations thereof, or the like may be utilized. The planarization process exposes the fins 52 such that top surfaces of the fins 52 and the insulation material 54 are level after the planarization process is complete. In embodiments in which a mask remains on the fins 52, the planarization process may expose the mask or remove the mask such that top surfaces of the mask or the fins 52, respectively, and the insulation material 54 are level after the planarization process is complete.

Figure 6:
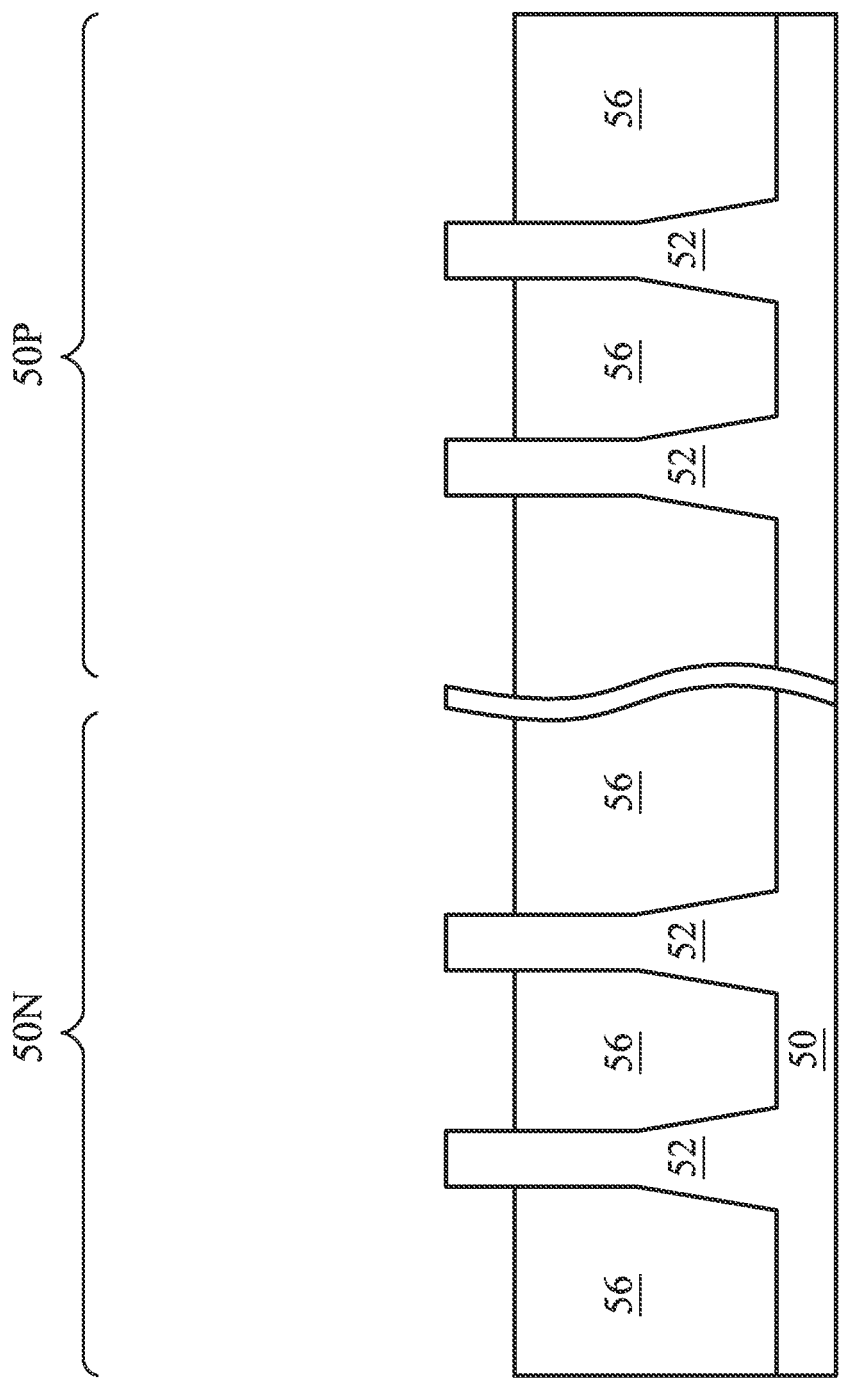

In FIG. 6, the insulation material 54 is recessed to form Shallow Trench Isolation (STI) regions 56. The insulation material 54 is recessed such that upper portions of fins 52 in the region 50N and in the region 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, an oxide removal using, for example, dilute hydrofluoric (dHF) acid may be used.

The process described with respect to FIGS. 2 through 6 is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, the fins 52 in FIG. 5 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in region 50N (e.g., an NMOS region) different from the material in region 50P (e.g., a PMOS region). In various embodiments, upper portions of the fins 52 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further in FIG. 6, appropriate wells (not shown) may be formed in the fins 52 and/or the substrate 50. In some embodiments, a P well may be formed in the region 50N, and an N well may be formed in the region 50P. In some embodiments, a P well or an N well are formed in both the region 50N and the region 50P.

In the embodiments with different well types, the different implant steps for the region 50N and the region 50P may be achieved using a photoresist or other masks (not shown). For example, a photoresist may be formed over the fins 52 and the STI regions 56 in the region 50N. The photoresist is patterned to expose the region 50P of the substrate 50, such as a PMOS region. The photoresist can be formed by using a spin-on technique and can be patterned using acceptable photolithography techniques. Once the photoresist is patterned, an n-type impurity implant is performed in the region 50P, and the photoresist may act as a mask to substantially prevent n-type impurities from being implanted into the region 50N, such as an NMOS region. The n-type impurities may be phosphorus, arsenic, antimony, or the like implanted in the region to a concentration of equal to or less than $10^{18}$ $cm^{-3}$, such as between about $10^{16}$ $cm^{-3}$ and about $10^{18}$ $cm^{-3}$. After the implant, the photoresist is removed, such as by an acceptable ashing process.

Following the implanting of the region 50P, a photoresist is formed over the fins 52 and the STI regions 56 in the region 50P. The photoresist is patterned to expose the region 50N of the substrate 50, such as the NMOS region. The photoresist can be formed by using a spin-on technique and can be patterned using acceptable photolithography techniques. Once the photoresist is patterned, a p-type impurity implant may be performed in the region 50N, and the photoresist may act as a mask to substantially prevent p-type impurities from being implanted into the region 50P, such as the PMOS region. The p-type impurities may be boron, boron fluoride, indium, or the like implanted in the region to a concentration of equal to or less than $10^{18}$ $cm^{-3}$, such as between about $10^{16}$ $cm^{-3}$ and about $10^{18}$ $cm^{-3}$. After the implant, the photoresist may be removed, such as by an acceptable ashing process.

After the implants of the region 50N and the region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 7:
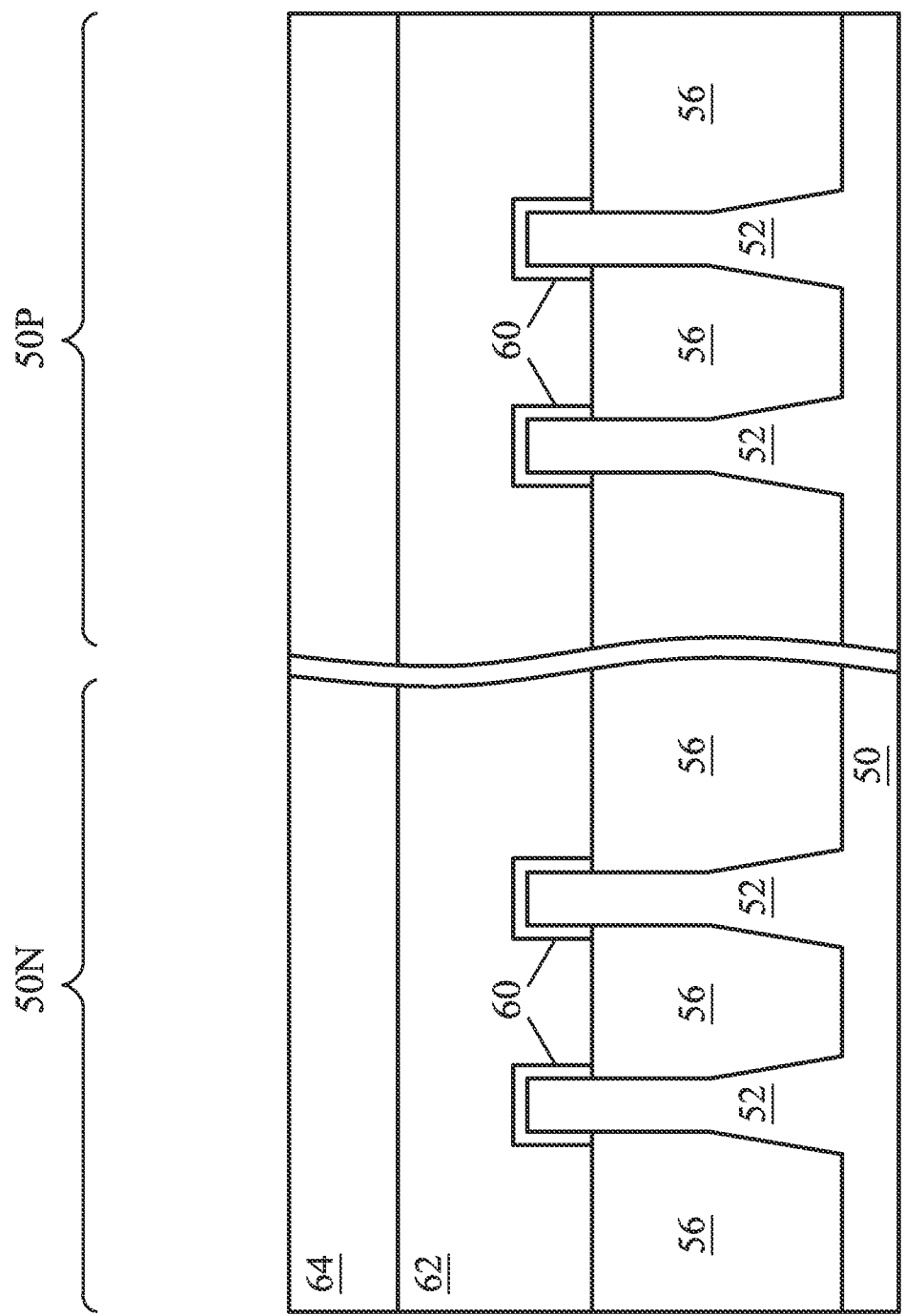

In FIG. 7, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive or non-conductive material and may be selected from a group including amorphous silicon, polycrystalline-silicon (polysilicon), polycrystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques known and used in the art for depositing the selected material. The dummy gate layer 62 may be made of other materials that have a high etching selectivity from the etching of isolation regions. The mask layer 64 may include, for example, silicon nitride, silicon oxynitride, or the like. In this example, a single dummy gate layer 62 and a single mask layer 64 are formed across the region 50N and the region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending between the dummy gate layer 62 and the STI regions 56.

FIGS. 8A through 15B illustrate various additional steps in the manufacturing of embodiment devices. FIGS. 8A through 15B illustrate features in either of the region 50N and the region 50P. For example, the structures illustrated in FIGS. 8A through 15B may be applicable to both the region 50N and the region 50P. Differences (if any) in the structures of the region 50N and the region 50P are described in the text accompanying each figure.

Figure 8B:
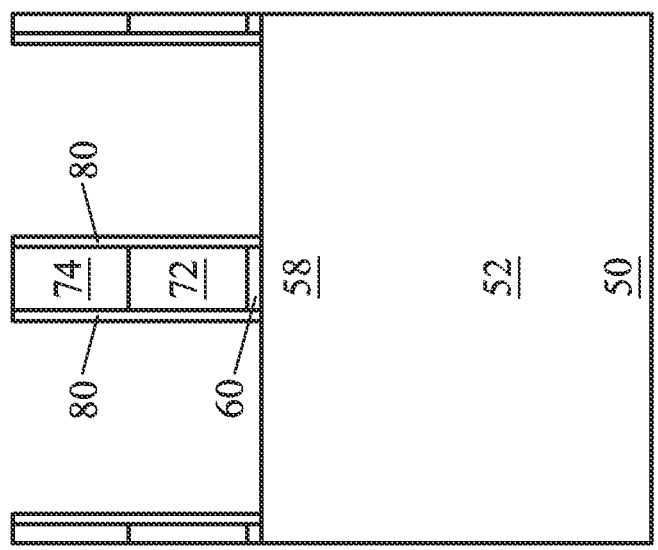
Figure 8A:
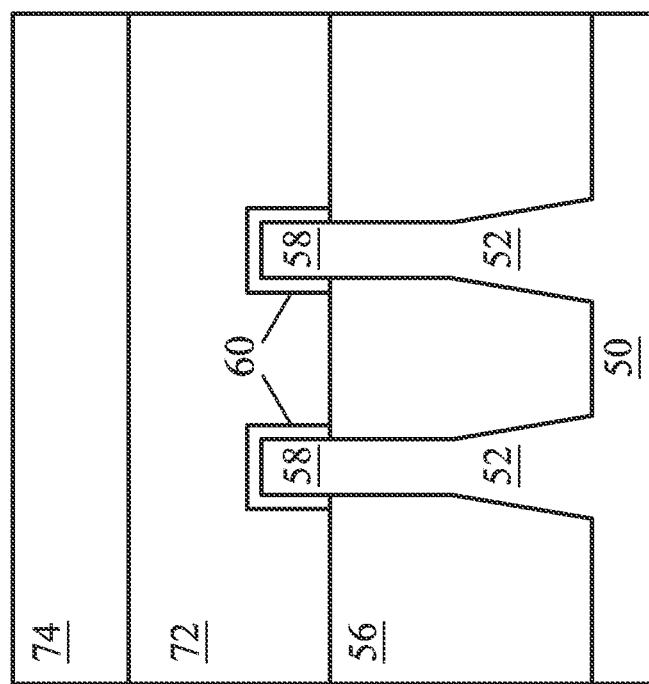

In FIGS. 8A and 8B, the mask layer 64 (see FIG. 7) may be patterned using acceptable photolithography and etching techniques to form masks 74. The pattern of the masks 74 then may be transferred to the dummy gate layer 62. In some embodiments (not illustrated), the pattern of the masks 74 may also be transferred to the dummy dielectric layer 60 by an acceptable etching technique to form dummy gates 72. The dummy gates 72 cover respective channel regions 58 of the fins 52. The pattern of the masks 74 may be used to physically separate each of the dummy gates 72 from adjacent dummy gates. The dummy gates 72 may also have a lengthwise direction substantially perpendicular to the lengthwise direction of respective epitaxial fins 52.

Further in FIGS. 8A and 8B, gate seal spacers 80 can be formed on exposed surfaces of the dummy gates 72, the masks 74, and/or the fins 52. A thermal oxidation or a deposition followed by an anisotropic etch may form the gate seal spacers 80. The gate seal spacers 80 may be formed of silicon oxide, silicon nitride, silicon oxynitride, or the like.

After the formation of the gate seal spacers 80, implants for lightly doped source/drain (LDD) regions (not explicitly illustrated) may be performed. In the embodiments with different device types, similar to the implants discussed above in FIG. 6, a mask, such as a photoresist, may be formed over the region 50N, while exposing the region 50P, and appropriate type (e.g., p-type) impurities may be implanted into the exposed fins 52 in the region 50P. The mask may then be removed. Subsequently, a mask, such as a photoresist, may be formed over the region 50P while exposing the region 50N, and appropriate type impurities (e.g., n-type) may be implanted into the exposed fins 52 in the region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{19}$ cm$^{-3}$. An anneal may be used to repair implant damage and to activate the implanted impurities.

Figure 9B:
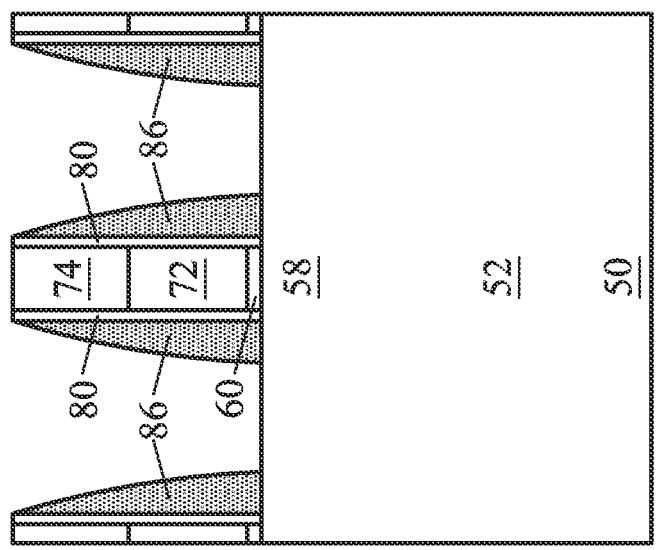
Figure 9A:
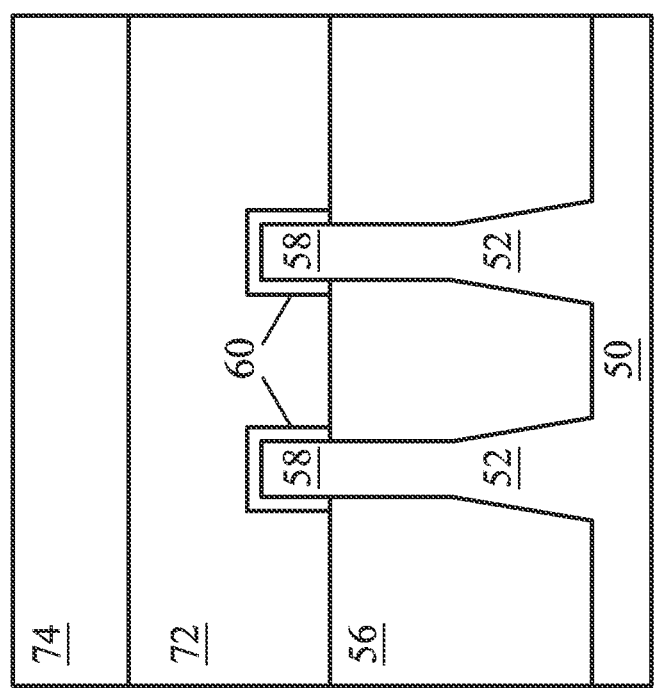

In FIGS. 9A and 9B, gate spacers 86 are formed on the gate seal spacers 80 along sidewalls of the dummy gates 72 and the masks 74. The gate spacers 86 may be formed by conformally depositing an insulating material and subsequently anisotropically etching the insulating material. The insulating material of the gate spacers 86 may be silicon oxide, silicon nitride, silicon oxynitride, silicon carbonitride, a combination thereof, or the like.

It is noted that the above disclosure generally describes a process of forming spacers and LDD regions. Other processes and sequences may be used. For example, fewer or additional spacers may be utilized, different sequence of steps may be utilized (e.g., the gate seal spacers 80 may not be etched prior to forming the gate spacers 86, yielding "L-shaped" gate seal spacers, spacers may be formed and removed, and/or the like). Furthermore, the n-type and p-type devices may be formed using a different structures and steps. For example, LDD regions for n-type devices may be formed prior to forming the gate seal spacers 80 while the LDD regions for p-type devices may be formed after forming the gate seal spacers 80.

Figure 10B:
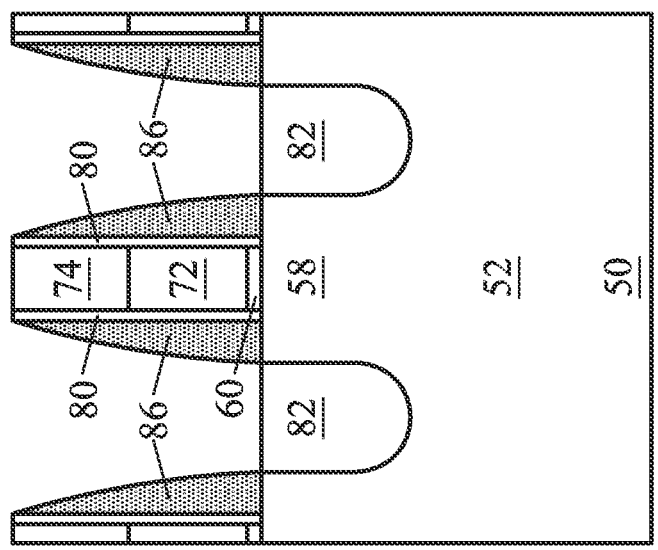
Figure 10A:
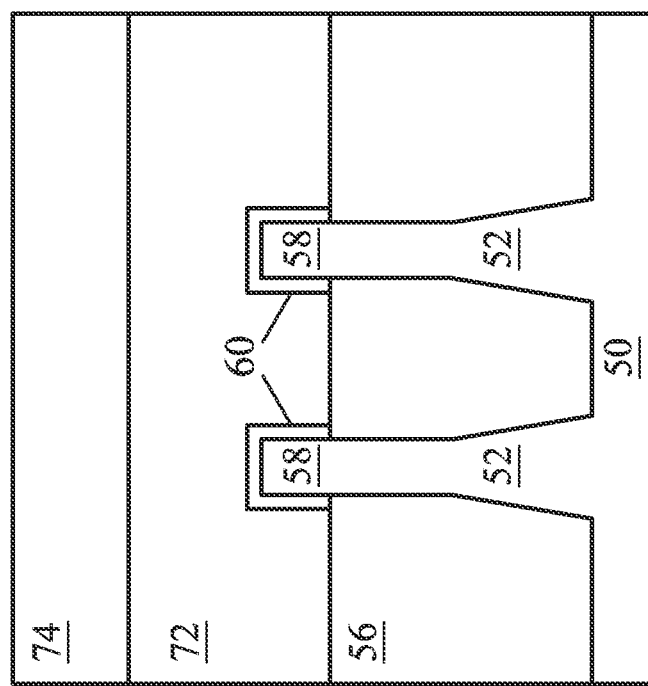
Figure 10D:
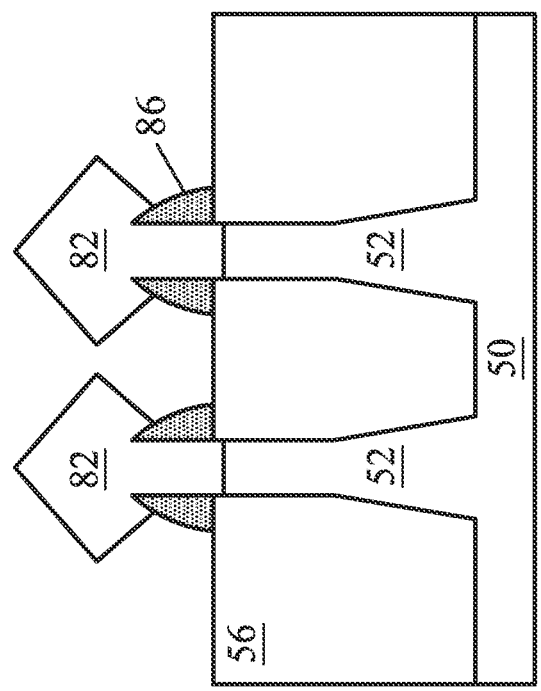
Figure 10C:
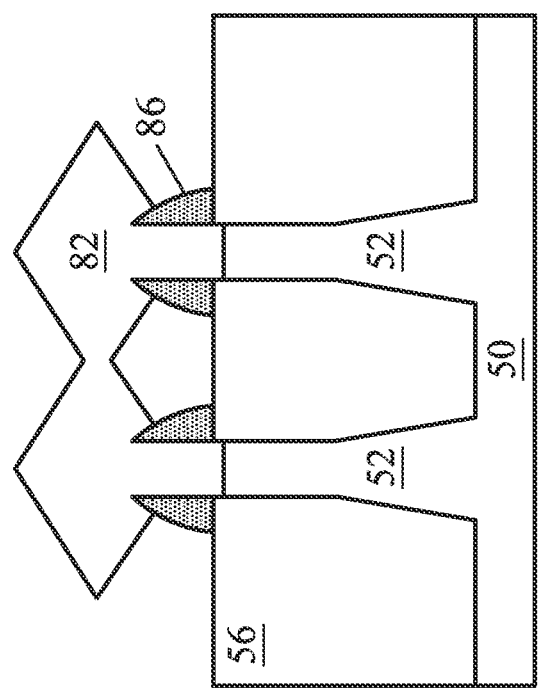

In FIGS. 10A and 10B, epitaxial source/drain regions 82 are formed in the fins 52, in accordance with some embodiments. In some cases, the epitaxial source/drain regions 82 may be formed to exert stress in the respective channel regions 58, thereby improving performance. The epitaxial source/drain regions 82 are formed in the fins 52 such that each dummy gate 72 is disposed between respective neighboring pairs of the epitaxial source/drain regions 82. In some embodiments the epitaxial source/drain regions 82 may extend into, and may also penetrate through, the fins 52. In some embodiments, the gate spacers 86 are used to separate the epitaxial source/drain regions 82 from the dummy gates 72 by an appropriate lateral distance so that the epitaxial source/drain regions 82 do not short out subsequently formed gates of the resulting FinFETs.

The epitaxial source/drain regions 82 in the region 50N, e.g., the NMOS region, may be formed by masking the region 50P, e.g., the PMOS region, and etching source/drain regions of the fins 52 in the region 50N to form recesses in the fins 52. Then, the epitaxial source/drain regions 82 in the region 50N are epitaxially grown in the recesses. The epitaxial source/drain regions 82 may include any acceptable material, such as appropriate for n-type FinFETs. For example, if the fin 52 is silicon, the epitaxial source/drain regions 82 in the region 50N may include materials exerting a tensile strain in the channel region 58, such as silicon, silicon carbide, phosphorous doped silicon carbide, silicon phosphide, or the like. The epitaxial source/drain regions 82 in the region 50N may have surfaces raised from respective surfaces of the fins 52 and may have facets.

The epitaxial source/drain regions 82 in the region 50P, e.g., the PMOS region, may be formed by masking the region 50N, e.g., the NMOS region, and etching source/drain regions of the fins 52 in the region 50P to form recesses in the fins 52. Then, the epitaxial source/drain regions 82 in the region 50P are epitaxially grown in the recesses. The epitaxial source/drain regions 82 may include any acceptable material, such as appropriate for p-type FinFETs. For example, if the fin 52 is silicon, the epitaxial source/drain regions 82 in the region 50P may comprise materials exerting a compressive strain in the channel region 58, such as silicon-germanium, boron doped silicon-germanium, germanium, germanium tin, or the like. The epitaxial source/drain regions 82 in the region 50P may also have surfaces raised from respective surfaces of the fins 52 and may have facets.

The epitaxial source/drain regions 82 and/or the fins 52 may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 82 may be in situ doped during growth.

As a result of the epitaxy processes used to form the epitaxial source/drain regions 82 in the region 50N and the region 50P, upper surfaces of the epitaxial source/drain regions have facets which expand laterally outward beyond sidewalls of the fins 52. In some embodiments, these facets cause adjacent source/drain regions 82 of a same FinFET to merge as illustrated by FIG. 10C. In other embodiments, adjacent source/drain regions 82 remain separated after the epitaxy process is completed as illustrated by FIG. 10D. In the embodiments illustrated in FIGS. 10C and 10D, gate spacers 86 are formed covering a portion of the sidewalls of the fins 52 that extend above the STI regions 56 thereby blocking the epitaxial growth. In some other embodiments, the spacer etch used to form the gate spacers 86 may be adjusted to remove the spacer material to allow the epitaxially grown region to extend to the surface of the STI region 56.

Figure 11B:
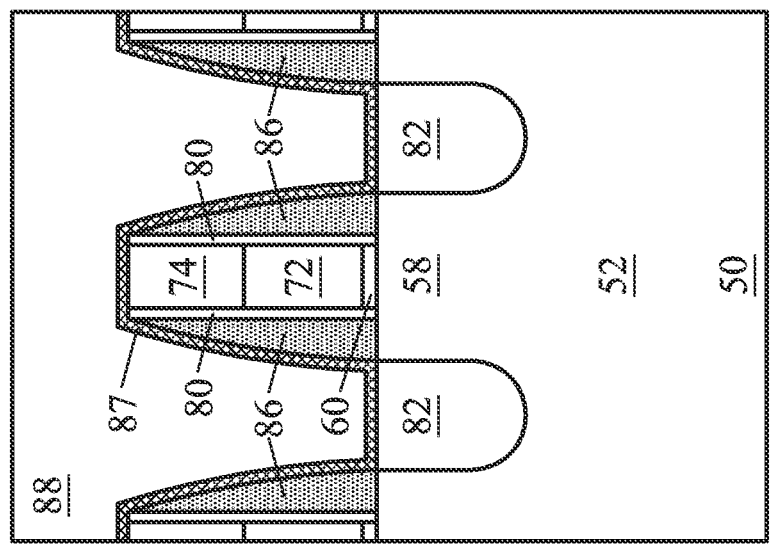
Figure 11A:
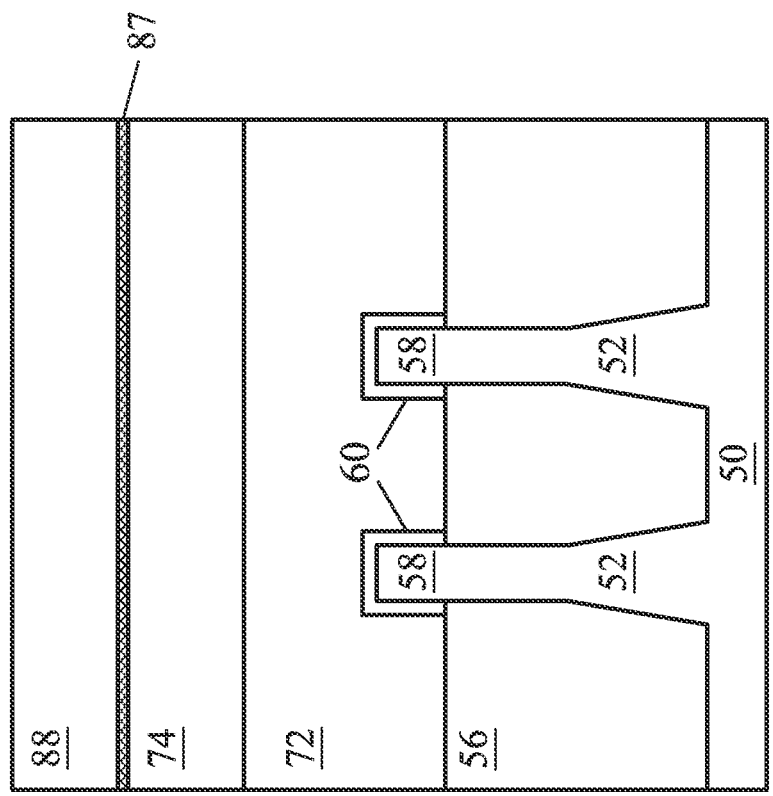

In FIGS. 11A and 11B, a first interlayer dielectric (ILD) 88 is deposited over the structure illustrated in FIGS. 10A and 10B, in accordance with some embodiments. The first ILD 88 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 87 is disposed between the first ILD 88 and the epitaxial source/ drain regions 82, the masks 74, and the gate spacers 86. The CESL 87 may comprise a dielectric material, such as silicon nitride, silicon oxide, silicon oxynitride, or the like, and may have a different etch rate than the material of the overlying first ILD 88. In some embodiments, the CESL 87 may be formed having a thickness between about 2 nm and about 5 nm, such as about 3 nm. In some cases, controlling the thickness of the CESL 87 can control the size (e.g., width or height) of the source/drain contacts 118 and/or the size (e.g., width or height) of the air gaps 120 formed subsequently (see FIG. 26).

Figure 12B:
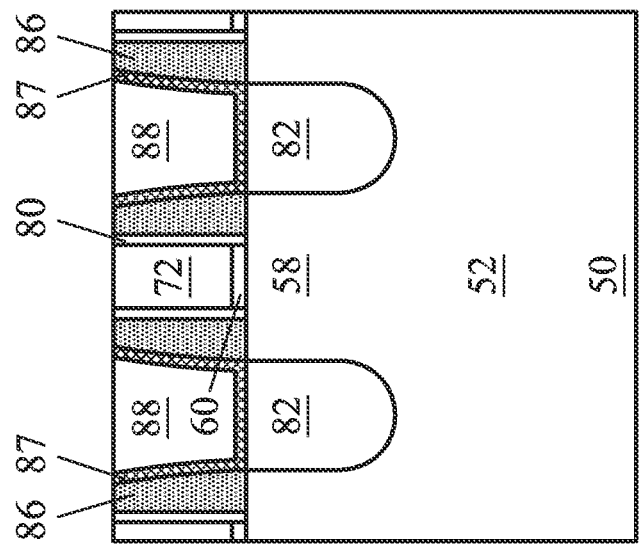
Figure 12A:
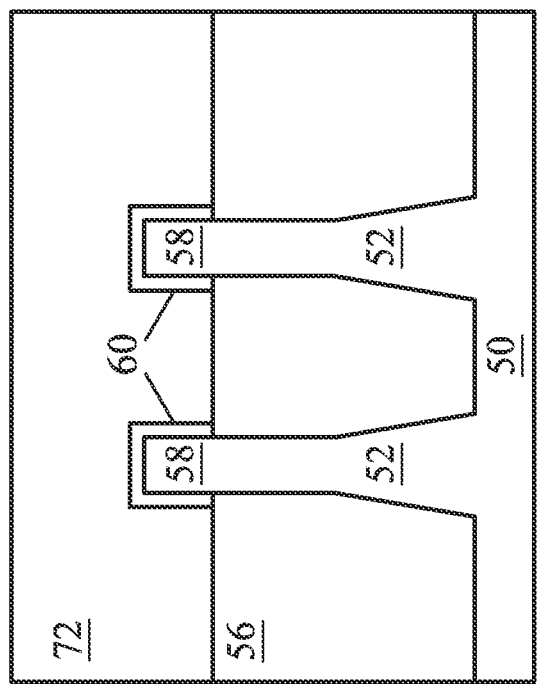

In FIGS. 12A and 12B, a planarization process, such as a CMP, may be performed to level the top surface of the first ILD 88 with the top surfaces of the dummy gates 72 or the masks 74. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the first ILD 88 are level. Accordingly, the top surfaces of the dummy gates 72 are exposed through the first ILD 88. In some embodiments, the masks 74 may remain, in which case the planarization process levels the top surface of the first ILD 88 with the top surface of the masks 74.

Figure 13B:
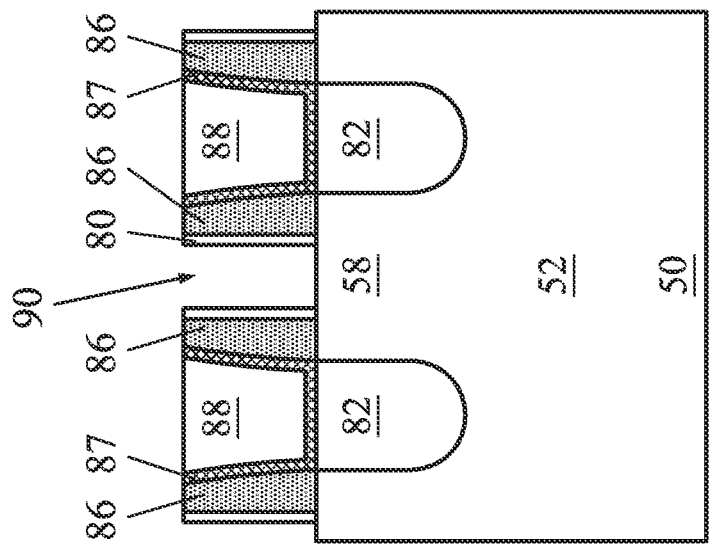
Figure 13A:
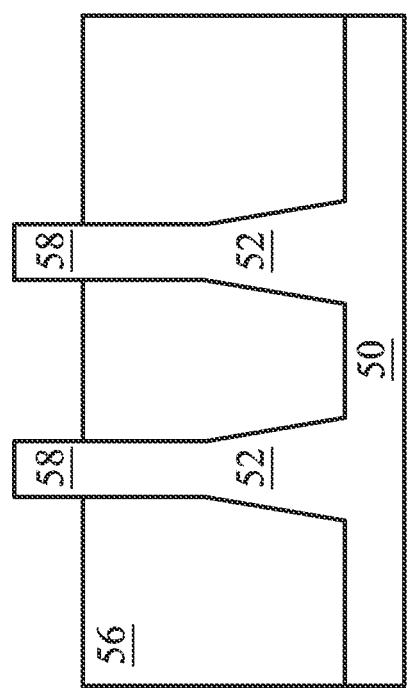

In FIGS. 13A and 13B, the dummy gates 72, and the masks 74 if present, are removed in one or more etching steps, so that recesses 90 are formed. Portions of the dummy dielectric layer 60 in the recesses 90 may also be removed. In some embodiments, only the dummy gates 72 are removed and the dummy dielectric layer 60 remains and is exposed by the recesses 90. In some embodiments, the dummy dielectric layer 60 is removed from recesses 90 in a first region of a die (e.g., a core logic region) and remains in recesses 90 in a second region of the die (e.g., an input/ output region). In some embodiments, the dummy gates 72 are removed by an anisotropic dry etch process. For example, the etching process may include a dry etch process using one or more reaction gases that selectively etch the dummy gates 72 without etching the first ILD 88, the gate spacers 86, or the CESL 87. Each recess 90 exposes and/or overlies a channel region 58 of a respective fin 52. Each channel region 58 is disposed between neighboring pairs of the epitaxial source/drain regions 82. During the removal, the dummy dielectric layer 60 may be used as an etch stop layer when the dummy gates 72 are etched. The dummy dielectric layer 60 may then be optionally removed after the removal of the dummy gates 72.

Figure 14B:
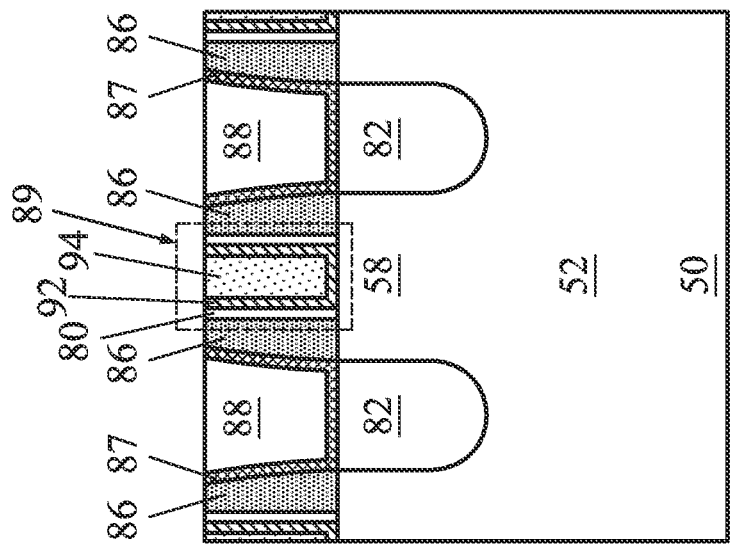
Figure 14A:
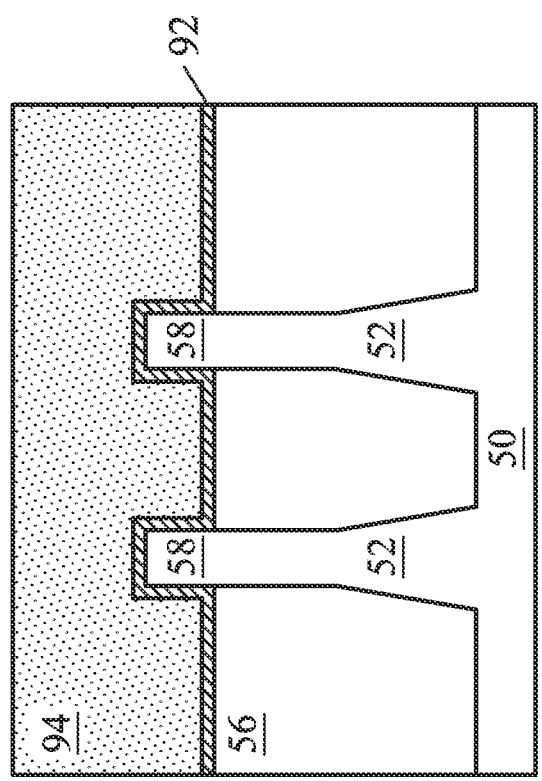
Figure 14C:
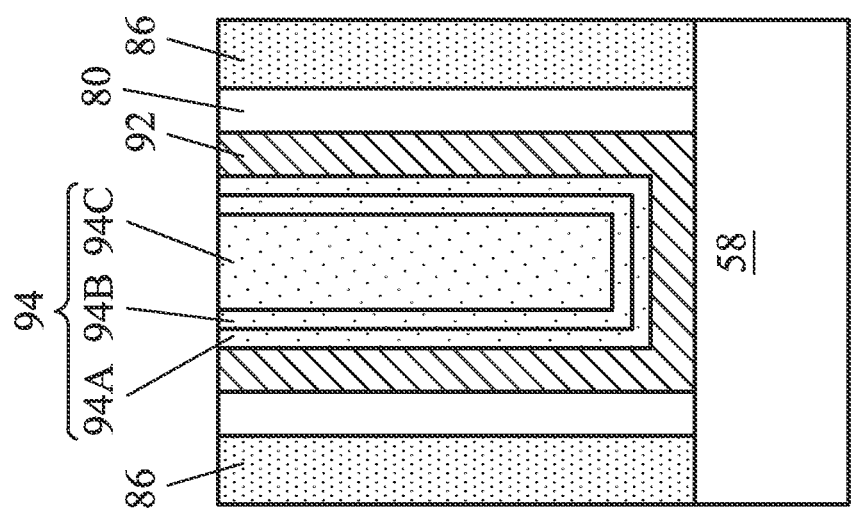

In FIGS. 14A and 14B, gate dielectric layers 92 and gate electrodes 94 are formed for replacement gates. FIG. 14C illustrates a detailed view of region 89 of FIG. 14B. Gate dielectric layers 92 are deposited conformally in the recesses 90, such as on the top surfaces and the sidewalls of the fins 52 and on sidewalls of the gate seal spacers 80/gate spacers 86. The gate dielectric layers 92 may also be formed on the top surface of the first ILD 88. In accordance with some embodiments, the gate dielectric layers 92 comprise silicon oxide, silicon nitride, or multilayers thereof. In some embodiments, the gate dielectric layers 92 include a high-k dielectric material, and in these embodiments, the gate dielectric layers 92 may have a k value greater than about 7.0, and may include a metal oxide or a silicate of hafnium, aluminum, zirconium, lanthanum, manganese, barium, titanium, lead, and combinations thereof. The formation methods of the gate dielectric layers 92 may include Molecular-Beam Deposition (MBD), ALD, PECVD, and the like. In embodiments where portions of the dummy dielectric layer 60 remains in the recesses 90, the gate dielectric layers 92 include a material of the dummy dielectric layer 60 (e.g., silicon oxide).

The gate electrodes 94 are deposited over the gate dielectric layers 92, respectively, and fill the remaining portions of the recesses 90. The gate electrodes 94 may include a metal-containing material such as titanium nitride, titanium oxide, tantalum nitride, tantalum carbide, cobalt, ruthenium, aluminum, tungsten, combinations thereof, or multi-layers thereof. For example, although a single layer gate electrode 94 is illustrated in FIG. 14B, the gate electrode 94 may comprise any number of liner layers 94A, any number of work function tuning layers 94B, and a fill material 94C as illustrated by FIG. 14C. After the filling of the recesses 90, a planarization process, such as a CMP, may be performed to remove the excess portions of the gate dielectric layers 92 and the material of the gate electrodes 94, which excess portions are over the top surface of the ILD 88. The remaining portions of material of the gate electrodes 94 and the gate dielectric layers 92 thus form replacement gates of the resulting FinFETs. The gate electrodes 94 and the gate dielectric layers 92 may be collectively referred to as a "gate stack." The gate and the gate stacks may extend along sidewalls of a channel region 58 of the fins 52.

The formation of the gate dielectric layers 92 in the region 50N and the region 50P may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and/or the gate electrodes 94 in each region may be formed by distinct processes, such that the gate electrodes 94 may be different materials. Various masking steps may be used to mask and expose appropriate regions when using distinct processes.

Figure 15B:
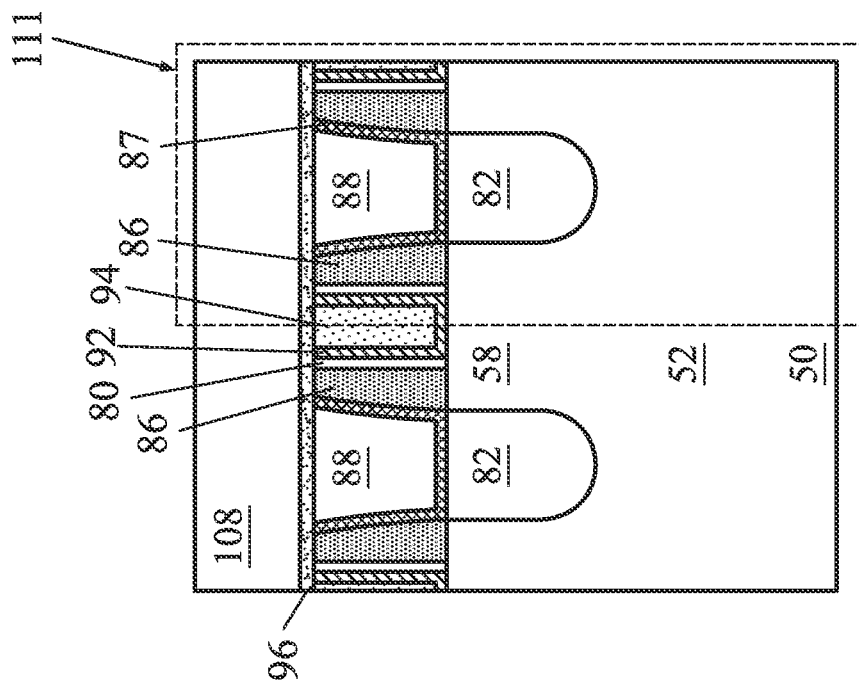
Figure 15A:
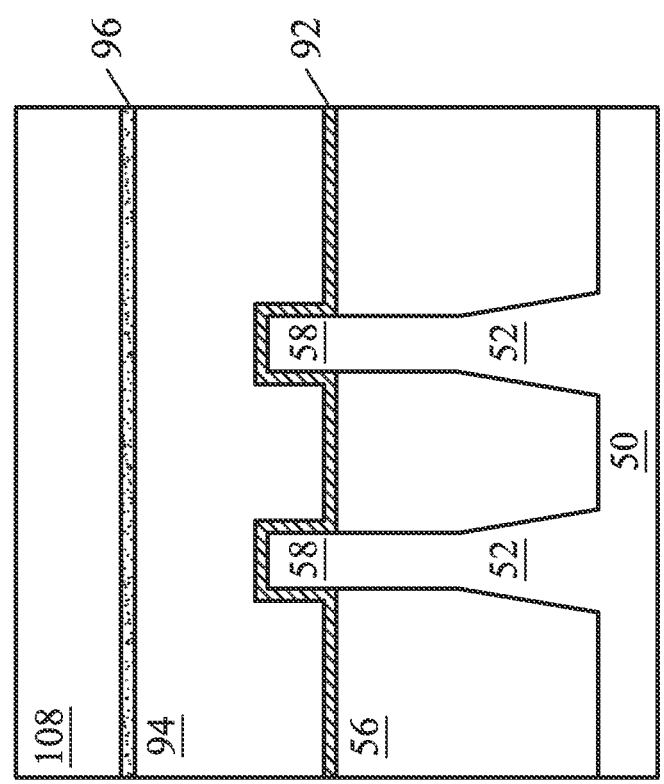

In FIGS. 15A and 15B, a second ILD 108 is deposited over the first ILD 88, in accordance with some embodiments. In some embodiments, the second ILD 108 is a flowable film formed by a flowable CVD method. In some embodiments, the second ILD 108 is formed of a dielectric material such as PSG, BSG, BPSG, USG, silicon oxide, or the like, and may be deposited by any suitable method, such as CVD, PECVD, or the like. A planarization process, such as a CMP, may be performed to planarize a surface of the second ILD 108. In some embodiments, the second ILD 108 may be formed having a thickness between about 10 nm and about 30 nm, such as about 15 nm. Controlling the thickness and width of the second ILD 108 can also control the size of the expanded regions 130 that seal the air gaps 120, described below with regard to FIG. 26.

In accordance with some embodiments, a hard mask 96 is deposited over the structure before depositing the second ILD 108. The hard mask 96 may comprise one or more layers of dielectric material, such as silicon nitride, silicon oxynitride, or the like, and may have a different etch rate than the material of the overlying second ILD 108. In some embodiments, the hard mask 96 may be formed having a thickness between about 2 nm and about 4 nm, such as about 3 nm. In some embodiments, the hard mask 96 is formed of the same material as the CESL 87 or is formed having about the same thickness as the CESL 87. The subsequently formed source/drain contacts 118 (see FIG. 26) penetrate through the hard mask 96 and the CESL 87 to contact a top surface of the epitaxial source/drain regions 82, and the gate contacts 132 (see FIGS. 31A and 31B) penetrate through the hard mask 96 to contact a top surface of the gate electrode 94.

FIGS. 16 through 26 illustrate intermediate steps in the formation of source/drain contacts 118 with air gaps 120 (see FIG. 26), in accordance with some embodiments. The source/drain contacts 118 physically and electrically contact the epitaxial source/drain regions 82. The source/drain contacts 118 may also be referred to as "contacts 118" or "contact plugs 118." For clarity, FIGS. 16 through 24 are shown as a detailed view of region 111 of FIG. 15B. FIG. 16 illustrates the region 111 of the same structure shown in FIG. 15B.

Figure 17:
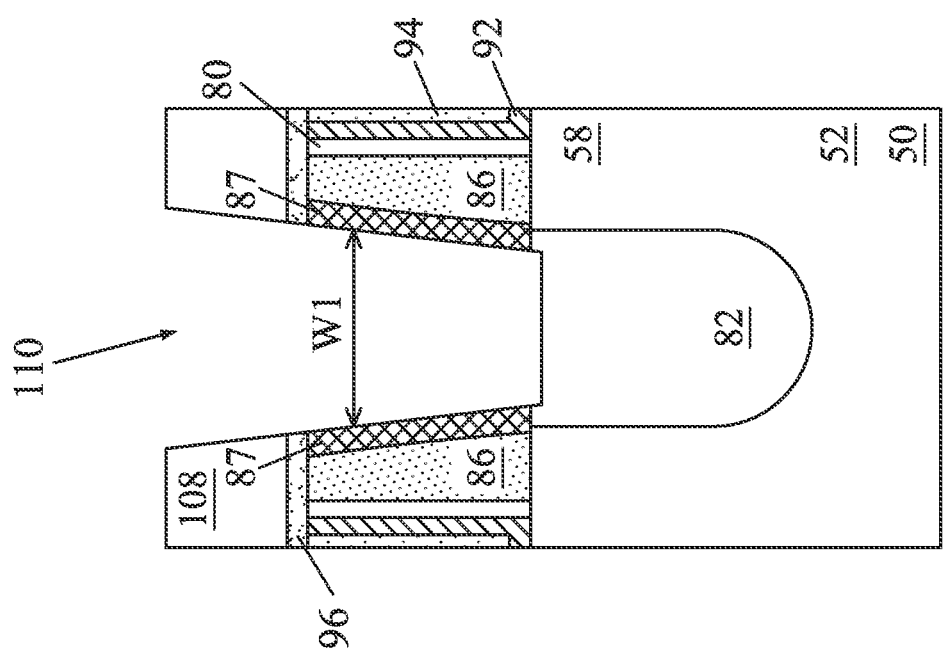

In FIG. 17, openings 110 are formed in the first ILD 88 and second ILD 108 to expose the epitaxial source/drain regions 82, in accordance with some embodiments. The openings 110 may be formed using suitable photolithography and etching techniques. For example, a photoresist (e.g., a single layer or multi-layer photoresist structure) may be formed over the second ILD 108. The photoresist may then be patterned to expose the second ILD 108 in regions corresponding to the openings 110. One or more suitable etching processes may then be performed to etch the openings 110, using the patterned photoresist as an etching mask. The one or more etching processes may include wet etching processes and/or dry etching processes. In some embodiments, the CESL 87 and/or the hard mask 96 may be used as an etch stop layer when forming the openings 110. As shown in FIG. 17, portions of the CESL 87 extending over the epitaxial source/drain regions 82 may also be removed. In some embodiments, the openings 110 may extend below a top surface of the epitaxial source/drain regions 82 and into the epitaxial source/drain regions 82. In some embodiments, the one or more etching processes may remove the material of the first ILD 88 to expose the CESL 87. The openings 110 may have tapered sidewalls as shown in FIG. 17 or may have sidewalls having a different profile (e.g., vertical sidewalls). In some embodiments, the openings 110 may have a width W1 that is between about 10 nm and about 30 nm. The width W1 may be measured across the top of the openings 110, across the bottom of the openings 110, or across the openings 110 at any other location. In some cases, controlling the width W1 can control the size of the source/drain contacts 118 and/or the size of the air gaps 120 formed subsequently (see FIG. 26).

Figure 18:
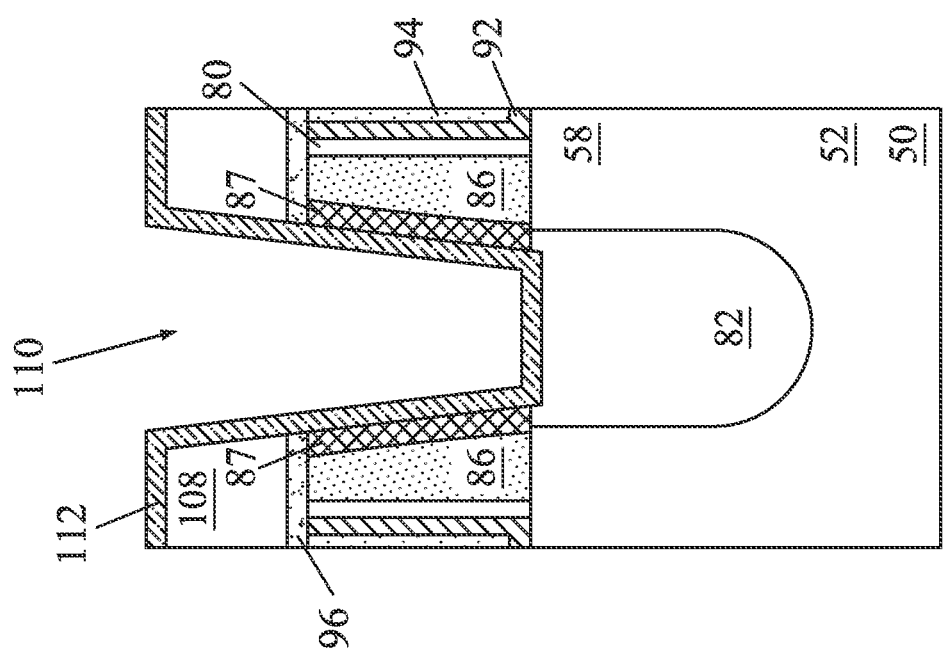

In FIG. 18, a dummy spacer layer 112 is formed over the openings 110, in accordance with some embodiments. The dummy spacer layer 112 may be formed as a blanket layer that extends over the second ILD 108, the CESL 87, and the epitaxial source/drain regions 82, in some embodiments. The dummy spacer layer 112 may comprise a material such as silicon, polysilicon, amorphous silicon, the like, or a combination thereof. In some embodiments, the dummy spacer layer 112 is a material that can be etched with a high selectivity relative to other layers, such as the second ILD 108, the CESL 87, or the contact spacer layer 114 (described below). The dummy spacer layer 112 may be deposited by PVD, CVD, ALD, or the like. In some embodiments, the dummy spacer layer 112 may be formed having a thickness between about 3 nm and about 9 nm, such as about 6 nm. In some embodiments, the thickness of the dummy spacer layer 112 corresponds to about the width W2 of the subsequently formed air gaps 120 (see FIG. 21).

Figure 19:
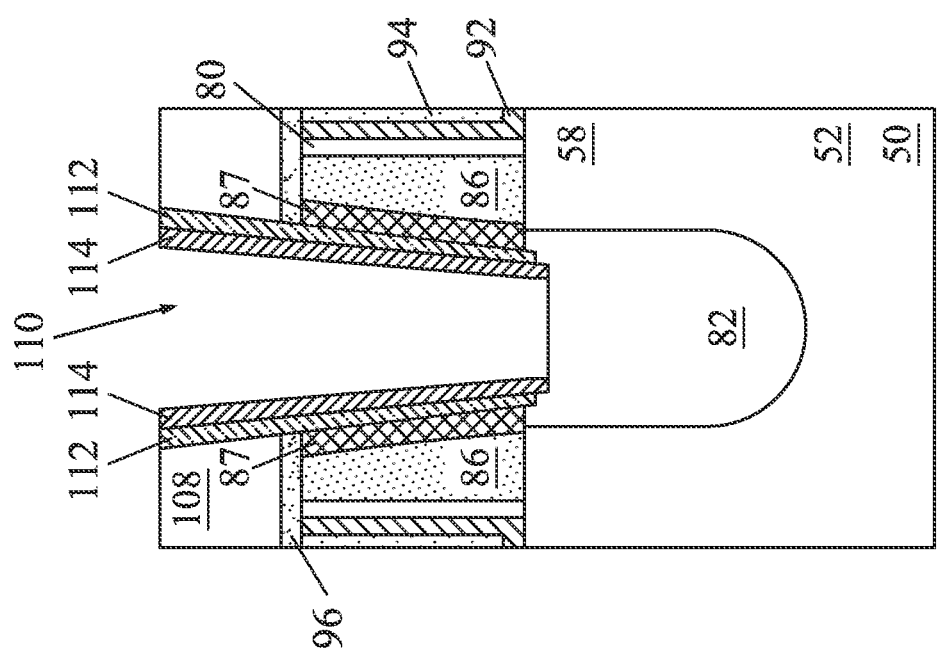

In FIG. 19, a contact spacer layer 114 is formed on the dummy spacer layer 112, in accordance with some embodiments. Prior to forming the contact spacer layer 114, a suitable anisotropic dry etching process may be performed to remove regions of the dummy spacer layer 112 extending laterally over the second ILD 108 and the epitaxial source/drain regions 82. Due to the anisotropy of the dry etching process, regions of the dummy spacer layer 112 extending along sidewalls of the openings 110 remain. In some embodiments, the anisotropic dry etching process may also etch the material of the epitaxial source/drain regions 82 and thus extend the openings 110 further into the epitaxial source/drain regions 82.

The contact spacer layer 114 may be formed as a blanket layer that extends over the second ILD 108, dummy spacer layer 112, and the epitaxial source/drain regions 82, in some embodiments. The contact spacer layer 114 may comprise one or more layers of materials such as silicon oxide, silicon nitride, silicon oxynitride, silicon carbonitride, the like, or a combination thereof. The contact spacer layer 114 may be deposited by PVD, CVD, ALD, or the like. In some embodiments, the contact spacer layer 114 may be formed having a thickness between about 2 nm and about 5 nm, such as about 3 nm. After forming the contact spacer layer 114, a suitable anisotropic dry etching process may be performed to remove regions of the contact spacer layer 114 extending laterally over the second ILD 108, the dummy spacer layer 112, and the epitaxial source/drain regions 82. Due to the anisotropy of the dry etching process, regions of the contact spacer layer 114 extending along sidewalls of the openings 110 (e.g., extending along the dummy spacer layer 112) remain. In some cases, controlling the thickness of the contact spacer layer 114 can control the size of the source/drain contacts 118 and/or the size of the air gaps 120 formed subsequently (see FIG. 26).

Figure 20:
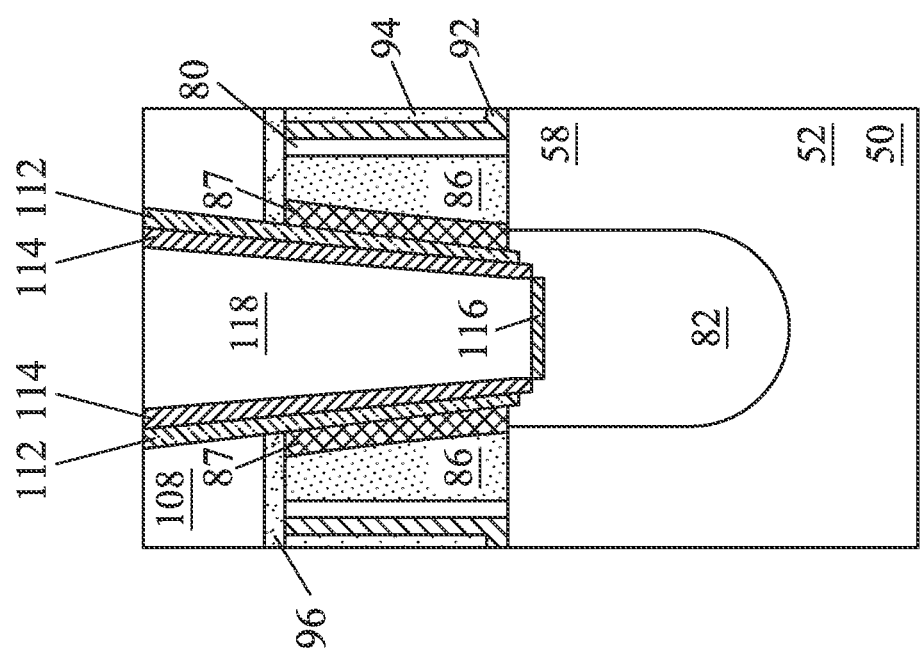

Turning to FIG. 20, one or more conductive materials are deposited in the openings 110, forming source/drain contacts 118, in accordance with some embodiments. In some embodiments, the conductive materials of the source/drain contacts 118 include a liner (not separately shown) conformally deposited on surfaces of the openings 110 (e.g., on the contact spacer layer 114) and a conductive fill material deposited on the liner to fill the openings 110. In some embodiments, the liner comprises titanium, cobalt, nickel, titanium nitride, titanium oxide, tantalum nitride, tantalum oxide, the like, or a combination thereof. In some embodiments, the conductive fill material comprises cobalt, tungsten, copper, aluminum, gold, silver, alloys thereof, the like, or combinations thereof. The liner or the conductive fill material may be deposited using one or more suitable processes, such as CVD, PVD, ALD, sputtering, plating, or the like.

In some embodiments, silicide regions 116 may also be formed on upper portions of the epitaxial source/drain regions 82 to improve electrical connection between the epitaxial source/drain regions 82 and the source/drain contacts 118. In some embodiments, silicide regions 116 may be formed by reacting upper portions of the epitaxial source/drain regions 82 with the liner. In some embodiments, a separate material may be deposited on the epitaxial source/drain regions 82 to be reacted with the epitaxial source/drain regions 82 to form silicide regions 116. The silicide regions 116 may comprise a titanium silicide, a nickel silicide, the like, or a combination thereof. In some embodiments, one or more annealing processes are performed to facilitate the silicide formation reaction. After the conductive fill material for the source/drain contacts 118 is deposited, excess material may be removed by using a planarization process, such as a CMP, to form top surfaces of the source/drain contacts 118 coplanar with the top surface of the second ILD 108.

Figure 21:
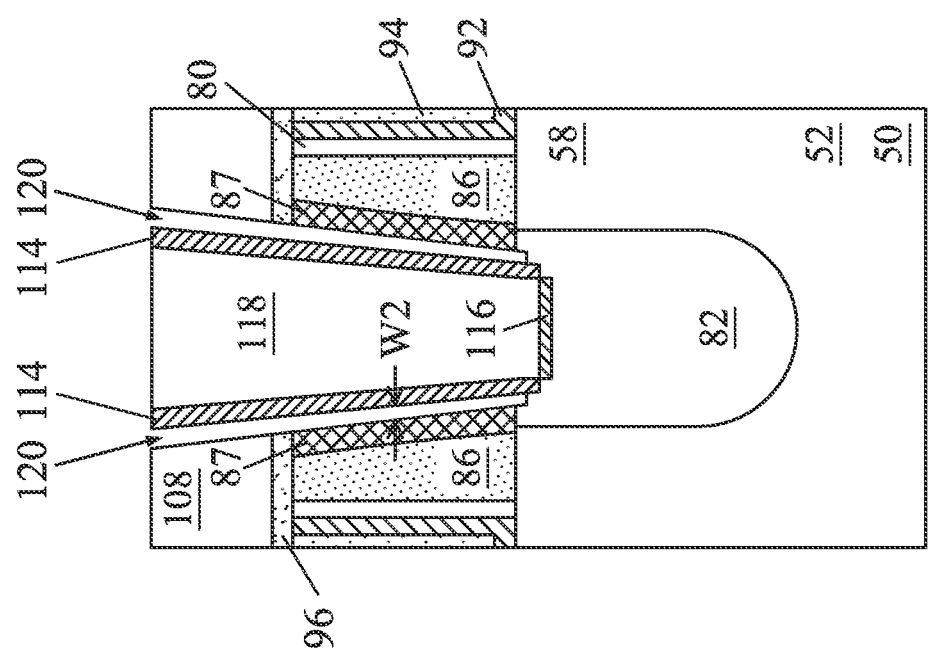

Turning to FIG. 21, the material of the dummy spacer layer 112 is removed to form air gaps 120, in accordance with some embodiments. The material of the dummy spacer layer 112 may be removed using a suitable etching process, such as a dry etching process. The etching process may be selective to the material of the dummy spacer layer 112 over the material of the second ILD 108, the CESL 87, or the contact spacer layer 114. For example, in an embodiment in which the dummy spacer layer 112 comprises silicon and the contact spacer layer 114 comprises silicon nitride, the etching process may include using HBr, $O_2$, He, $CH_3F$, $H_2$, the like, or combinations thereof as process gases in a plasma etching process that selectively etches the silicon of the dummy spacer layer 112. Other materials or etching processes are possible.

In some embodiments, the air gaps 120 may be formed having a width W2 between about 0.5 nm and about 4 nm, such as about 2.5 nm. In some cases, forming the air gaps 120 having a larger width W2 can result in reduced capacitance and improved device performance, described in greater detail below. The air gaps 120 may have a substantially uniform width or the width may vary along their vertical length (e.g., the length extending away from substrate 50). For example, the width of the air gaps 120 may be smaller near the bottom (e.g., near the epitaxial source/drain regions 82) than near the top (e.g., near the second ILD 108). In some embodiments, the bottom of the air gaps 120 may extend into the epitaxial source/drain regions 82 (as shown in FIG. 21), or the air gaps 120 may have a bottom at or above a top surface of the epitaxial source/drain regions 82. The air gaps 120 may extend at an angle relative to a vertical axis, as shown in FIG. 21, or may extend substantially along a vertical axis.

In some cases, by forming the air gaps 120 between the source/drain contact 118 and the gate stack 92/94, the capacitance between the source/drain contact 118 and the gate stack 92/94 may be reduced. The capacitance may be reduced in this manner due to the lower dielectric constant (k-value) of air, about k=1, relative to other spacer materials such as silicon oxides, silicon nitrides, or the like. By reducing the capacitance using the air gaps 120, the FinFET device may have faster response speed and improved performance at higher frequency operation.

Figure 22:
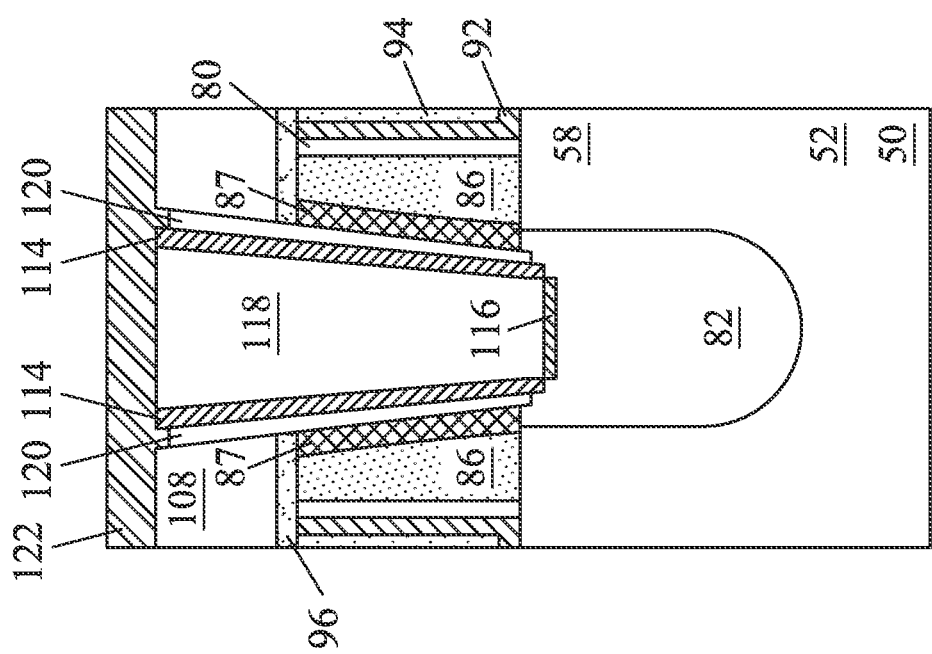

Turning to FIG. 22, a capping layer 122 is formed over the second ILD 108, the source/drain contacts 118, and over the air gaps 120. The capping layer 122 may be formed as a blanket layer extending across the air gaps 120, such that the air gaps 120 are enclosed. In some embodiments, some of the material of the capping layer 122 may partially extend into the air gaps 120 (as shown in FIG. 22), but in other embodiments, the air gaps 120 remain free of the material of the capping layer 122. In this manner, the air gaps 120 are not filled by the capping layer 122 but are enclosed regions of air adjacent the source/drain contacts 118. In some embodiments, the capping layer 122 is subsequently used as an etch stop layer for forming conductive features 136 on the source/drain contacts 118, described below in FIGS. 32A and 32B.

The capping layer 122 may comprise one or more layers of materials such as silicon nitride, silicon oxynitride, silicon carbonitride, silicon oxycarbonitride, the like, or a combination thereof. The capping layer 122 may be deposited by PVD, CVD, ALD, or the like. In some embodiments, the capping layer 122 may be formed having a thickness between about 6 nm and about 16 nm, such as about 11 nm. In some cases, a thicker capping layer 122 may decrease the amount of vertical expansion of the second ILD 108 from the implantation process 124, described below in FIG. 23. In some cases, the implant depth of the implanted dopants may be controlled by controlling the thickness of the capping layer, also described below in FIG. 23.

Figure 23:
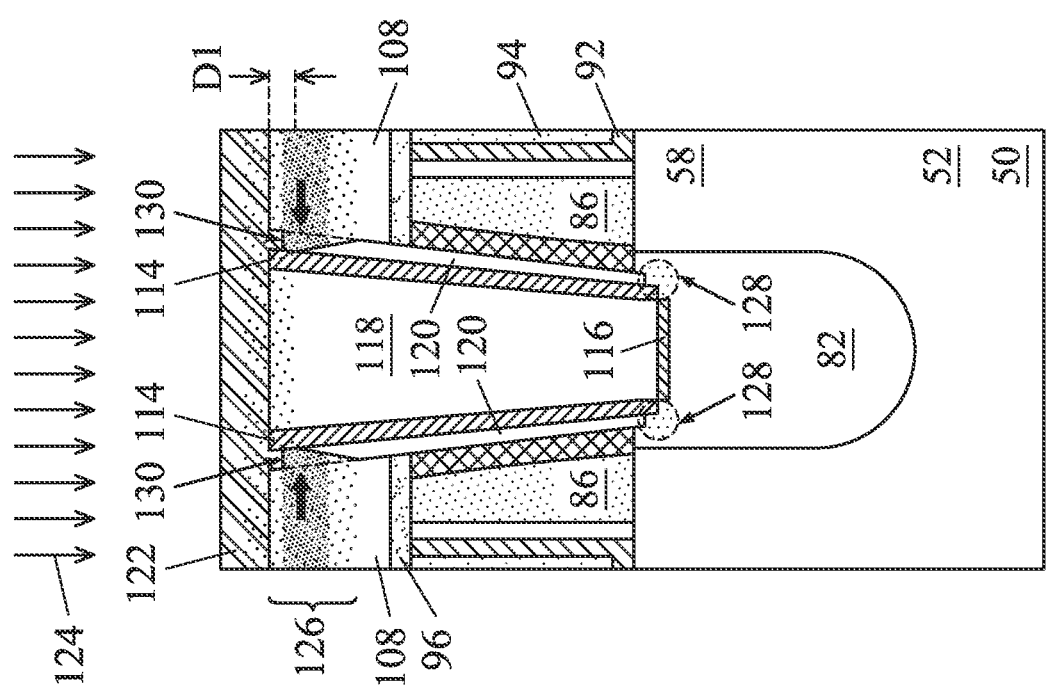

In FIG. 23, an implantation process 124 is performed through the capping layer 122 to implant the second ILD 108 with dopants to seal the air gaps 120, in accordance with some embodiments. In some embodiments, the implanted dopants cause the implanted regions 126 of the second ILD 108 to increase in volume relative to the unimplanted regions of the second ILD 108. The air gaps 120 provide a volume into which adjacent implanted regions 126 can expand. Portions of the implanted regions 126 that have expanded into the air gaps 120 are referred to herein as expanded regions 130. In some embodiments, the implantation process 124 can be controlled such that the expanded regions 130 extend fully across the width of the air gaps 120, sealing the air gaps 120. For example, the dose, implant depth, dopant species, angle, implant energy, or other characteristics of the implantation process 124 may be controlled to control the expansion of the implanted regions 126, described in greater detail below. Upper regions of the air gaps 120 may be bounded by the expanded regions 130, and/or lower regions of the air gaps 120 may be bounded by the source/drain regions 82.

By forming expanded regions 130 to seal the air gaps 120 in this manner, subsequently deposited material may be prevented from entering the air gaps 120. In some cases, subsequently deposited material entering an air gap 120 can cause process defects or device failure. For example, the capping layer 122 may be subsequently etched and conductive material deposited to form conductive features 136 (see FIG. 32B), and the expanded regions 130 prevent the conductive material from being deposited within an air gap 120 and possibly causing an electrical short. Additionally, in some cases, the material of the second ILD 108 may be a silicon oxide having a lower k-value than other materials such as a silicon nitride that may be used to seal the air gaps 120. In this manner, using the material of the second ILD 108 to seal the air gaps 120 may reduce capacitance relative to sealing the air gaps 120 using another material.

In some embodiments, the dopant species implanted by the implantation process 124 includes Ge, Ar, Xe, Si, the like, or a combination thereof. In some embodiments, the implanted dopants are an atomic species having a larger atomic radius than silicon. For example, when implanted into a second ILD 108 comprising silicon, the larger size of the implanted dopants can cause the implanted regions 126 of the second ILD 108 to increase in volume, forming expanded regions 130. In some embodiments, the implantation process 124 includes implanting the dopants at an angle from a vertical axis that is between about 0 degrees and about 60 degrees. In some cases, controlling the implantation angle can be beneficial depending on the application or device geometry. For example, the implantation process 124 may be performed at an angle to reduce straggle effects. In some embodiments, the implanted dose of dopants may be between about $10^{14}$ atoms/cm$^2$ and about $10^{16}$ atoms/cm$^2$. In some embodiments, the dopants may be implanted to a concentration of equal to or less than about $10^{22}$ cm$^{-3}$, such as between about $10^{19}$ cm$^{-3}$ and about $10^{22}$ cm$^{-3}$. Increasing the implanted dose or increasing the concentration of dopants within the implanted regions 126 can increase the expansion of the implanted regions 126. In some embodiments, the implantation temperature is in a range from about −100° C. to about 450° C.

Still referring to FIG. 23, the implant depth D1 indicates the depth of the greatest concentration of dopants within the second ILD 108 as measured from the top of the second ILD 108. In some embodiments, the implant depth D1 may be between about 0 nm and about 20 nm, such as about 5 nm. In some cases, the implant depth D1 corresponds approximately to the location of the implanted regions 126 having the greatest amount of expansion. Accordingly, by controlling the implant depth D1, the location of the expanded regions 130 can be controlled. It has been observed that an implant depth D1 above the second ILD 108 may result in incomplete sealing of the air gaps 120. It has been observed that an implant depth D1 more than about 10 nm may result in larger dopant regions 128, described in greater detail below. In some embodiments, the implant depth D1 may be determined by the parameters of the implantation process 124 and by the thickness of the capping layer 122. For example, by increasing the implantation energy, the implant depth D1 can be increased. In some embodiments, the dopants are implanted at an implantation energy between about 2 keV and about 30 keV, such as about 20 keV. As another example, by increasing the thickness of the capping layer 122, the dopants have to travel a longer distance through the capping layer 122 before reaching the second ILD 108, and thus the implant depth D1 is reduced. In this manner, the implant depth D1 can be controlled by controlling the implantation energy and/or the thickness of the capping layer 122.

Figure 24:
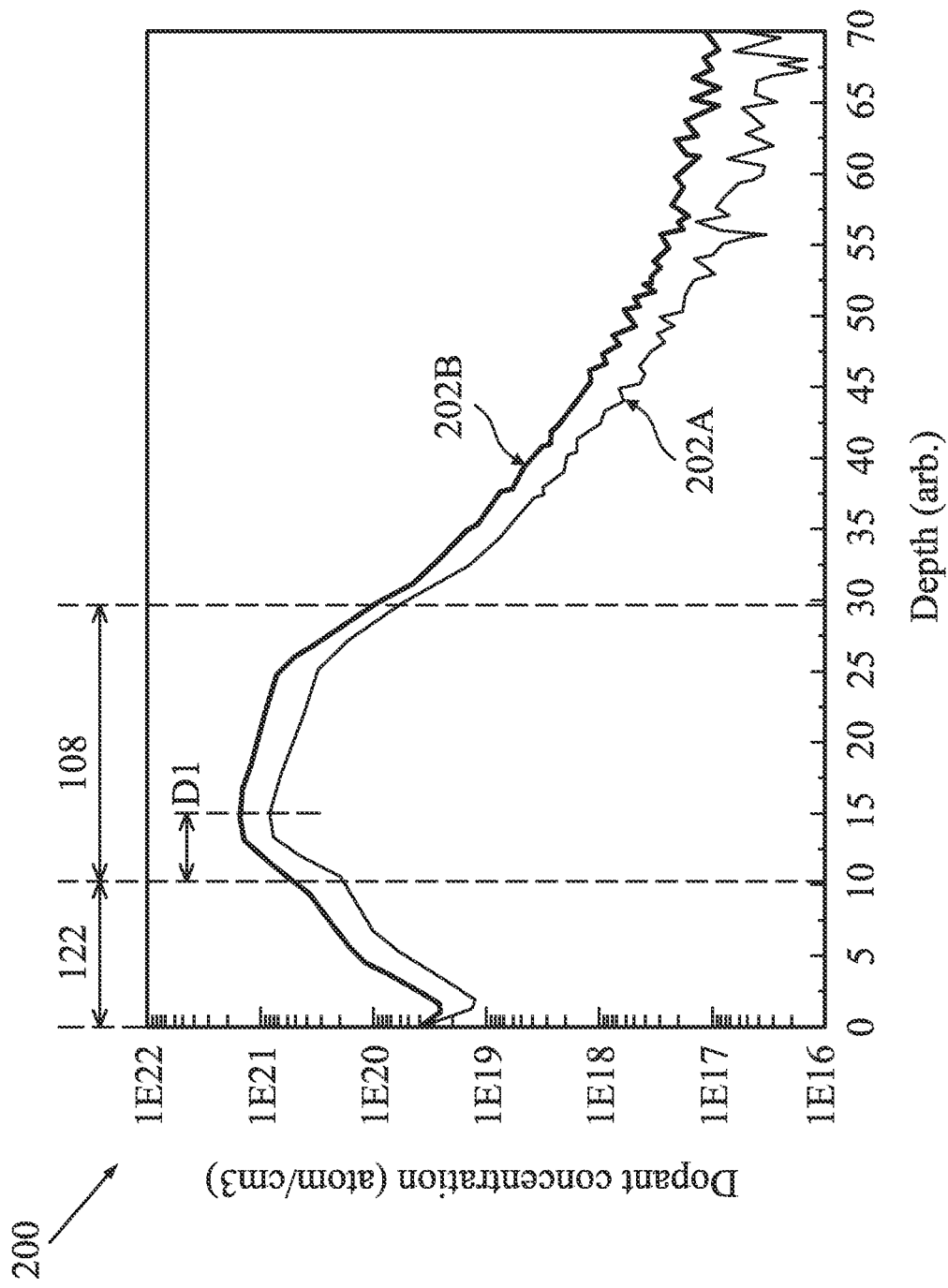
FIG. 24 shows experimental data of a dopant concentration profile, in accordance with some embodiments.

Turning to FIG. 24, an example dopant concentration profile 200 is shown, in accordance with some embodiments. The profile 200 shows experimental data of the concentration of implanted dopants as measured from the surface of the capping layer 122. The plot 202A shows a first concentration profile resulting from a first implanted dose, and the plot 202B shows a second concentration profile resulting from a second implanted dose that is greater than the first implanted dose. Both the plot 202A and the plot 202B correspond to an implantation having about the same implantation energy. The plot 202B corresponding to the second implanted dose shows a greater dopant concentration within the second ILD 108 than the plot 202A corresponding to the first implanted dose. As shown in the profile 200, the greatest concentration of implanted dopants is within the second ILD 108 at an implant depth D1. For the profile 200, the implant depth D1 is about 5 nm, though the implant depth D1 may be different in other cases. Because the plot 202A and the plot 202B correspond to implantations having about the same implantation energy, the implant depth D1 is about the same for both plot 202A and plot 202B.

In some embodiments, the capping layer 122 is formed over the second ILD 108 before performing the implantation process 124 in order to promote lateral expansion of the implanted regions 126 and suppress vertical expansion of the implanted regions 126. For example, the presence of a capping layer 122 over the second ILD 108 may prevent the second ILD 108 from expanding in a vertical direction. In this manner, the expansion of the second ILD 108 may be constrained to lateral expansion into the air gaps 120. By promoting the lateral expansion of the ILD 108 by forming the capping layer 122 prior to the implantation process 124, the expanded regions 130 may be formed more uniformly and seal the air gaps 120 more completely. Additionally, the air gaps 120 may be sealed by the expanded regions 130 using an implantation process 124 with a smaller implantation dose, which can reduce implantation damage.

Figure 25:
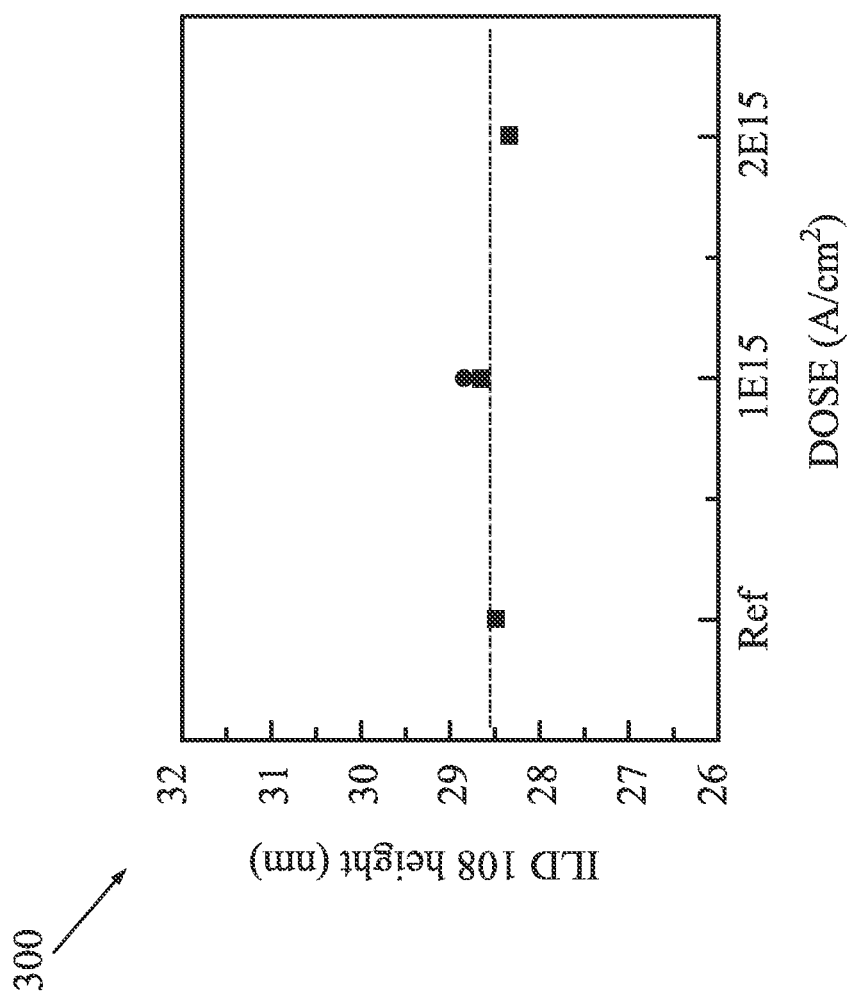
FIG. 25 shows experimental data of measured thicknesses of an interlayer dielectric having an overlying capping layer, in accordance with some embodiments.

In some cases, an overlying capping layer 122 can reduce vertical expansion of the second ILD 108. For example, FIG. 25 shows experimental data 300 of measured thicknesses of the second ILD 108 having an overlying capping layer 122. The data 300 shows the thickness of the second ILD prior to the implantation process 124 and after the implantation process 124 has been performed. The point indicated at "Ref" shows the thickness of a second ILD 108 prior to the implantation process 124, and the remaining points show the thickness of a second ILD 108 after the implantation process 124. As shown in FIG. 25, an overlying capping layer 122 can cause little or no vertical expansion of the second ILD 108, and the thickness of the second ILD 108 may remain substantially uniform. In this manner, the use of a capping layer 122 can allow for more planar top surfaces of the second ILD 108 and/or the capping layer 122 after performing the implantation process 124. A more planar second ILD 108 or capping layer 122 can improve the uniformity and alignment of subsequent processing steps. In some embodiments, a thicker capping layer 122 can suppress more vertical expansion than a thinner capping layer 122. In some embodiments, a thinner capping layer 122 (e.g., thinner than about 6 nm) may partially suppress the vertical expansion such that the vertical expansion is less than if no capping layer 122 were present. An embodiment in which no capping layer 122 is present is described below with regard to FIGS. 28 and 29.

Figure 26:
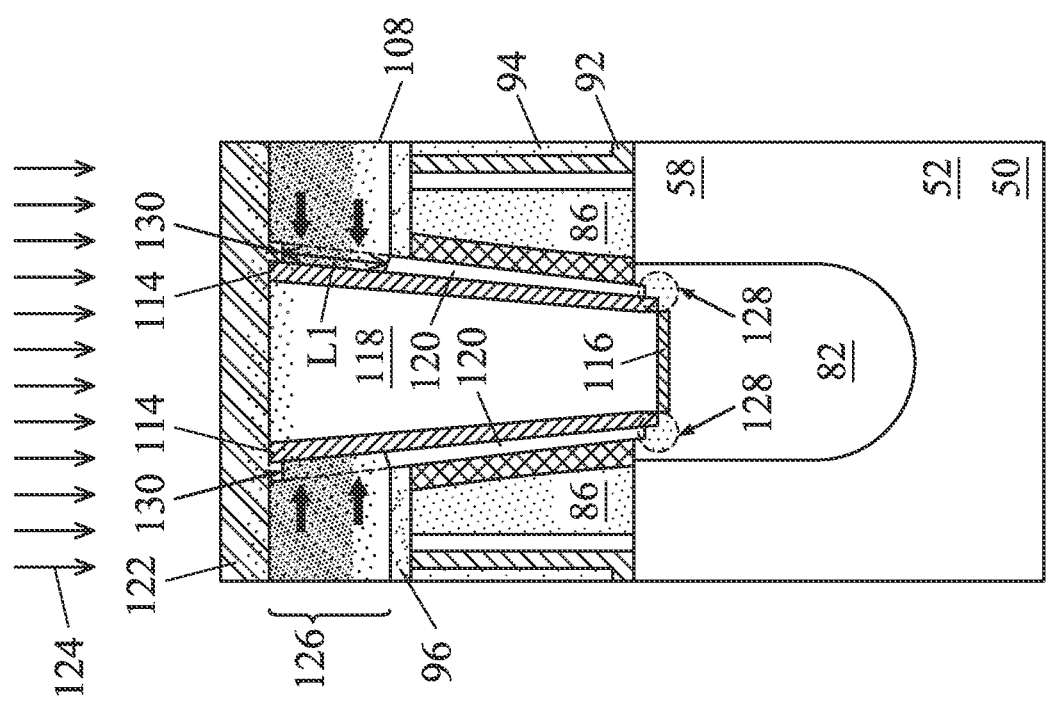

In some embodiments, the implantation process 124 may be controlled to control the size of the implanted regions 126 and thus control the size of the expanded regions 130. For example, FIG. 26 shows an embodiment in which the expanded regions 130 extend along the air gaps 120 a length L1 that is about equal to the thickness of the second ILD 108. In some embodiments, dopants are implanted throughout the full thickness of the second ILD 108, and all of the second ILD 108 that is exposed to the air gaps 120 expands into the air gaps 120 as expanded regions 130. In this manner, the thickness of the second ILD 108 may determine the length L1 of the expanded regions 130. In some embodiments, the length L1 of the expanded regions 130 may be between about 10% and about 105% of the thickness of the second ILD 108, which depends on the thickness of ILD 108 and implantation condition. In some embodiments, the implant depth D1 may determine the length L1 of the expanded regions 130, as a larger implant depth D1 may form expanded regions 130 having a larger L1. By controlling the size of the expanded regions 130, the vertical length (e.g., the distance between the top and bottom) of the air gaps 120 may also be controlled. In some embodiments, the vertical length of the air gaps 120 may be between about 12 nm and about 25 nm, such as about 16 nm.

Figure 27A:
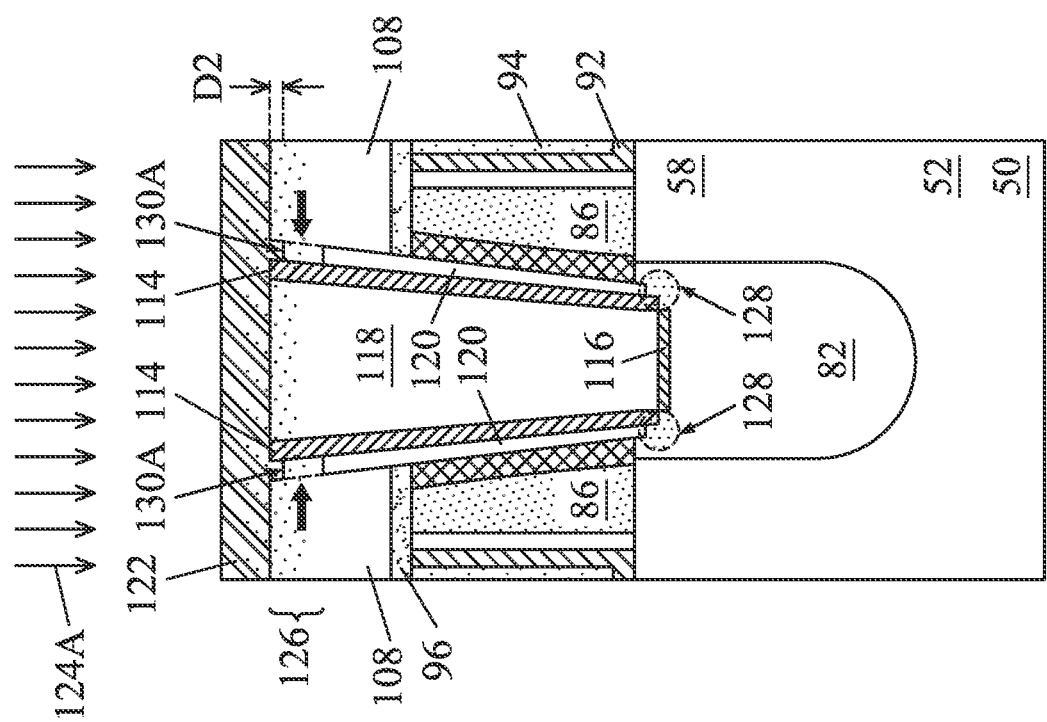
Figure 27B:
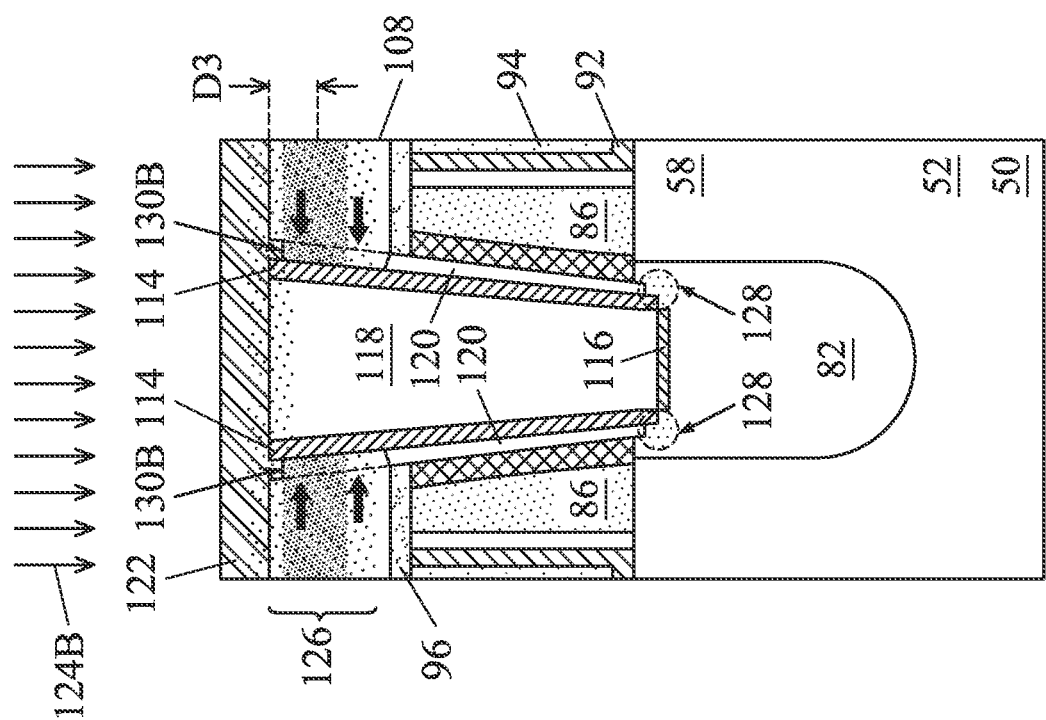

FIGS. 27A and 27B show an embodiment in which a two-step implantation process 124A-B is used to form the expanded regions 130. Referring to FIGS. 23 and 26 above, in some cases, some of the dopants implanted during the implantation process 124 migrate through the air gaps 120 and into dopant regions 128 near the bottom of the air gaps 120. In some cases, the dopant regions 128 may be located near the channel regions 58 of the fins 52. In some cases, the dopants within the dopant regions 128 may cause an increase in channel resistance or may cause other unwanted effects such as implant damage. The two-step implantation process 124A-B shown in FIGS. 27A and 27B may reduce the amount of dopants that migrate into the air gaps 120, and thus may reduce the size or dopant concentration of dopant regions 128. In some cases, the two-step implantation process 124A-B may block dopants from forming dopant regions 128. In some embodiments, the two step implantation process 124A-B includes a first implantation process 124A comprising a relatively small implantation energy or dose followed by a second implantation process 124B comprising a relatively large implantation energy or dose. In some embodiments, the implantation angle, dopant species, temperature, or other parameters of the first implantation process 124A may be different than those of the second implantation process 124B.

Turning to FIG. 27A, a first implantation process 124A is performed after the capping layer 122 is formed, similar to FIG. 23. In some embodiments, the first implantation process 124A uses a relatively small first implantation energy, and thus the first implant depth D2 is relatively shallow. For example, the first implant depth D2 may be between about 0 nm (e.g., at or near the top of the second ILD 108) and about 5 nm, such as about 1 nm. As shown in FIG. 27A, the first implantation process 124A forms first expanded regions 130A that seal the air gaps 120. The first expanded regions 130A block the dopants implanted by the second implantation process 124B from migrating into the air gaps 120. Due to the relatively small first implantation energy, few dopants enter the air gaps 120, and thus the dopant regions 128 are small and/or have a small concentration of dopants. For example, the dopant regions 128 formed by the first implantation process 124A may be less than those formed by the implantation process 124 described above in FIG. 23 or FIG. 26.

Turning to FIG. 27B, a second implantation process 124B is performed after first implantation process 124A. In some embodiments, the second implantation process 124B uses a relatively large second implantation energy, and thus the second implant depth D3 is larger than the first implant depth D2. For example, the second implant depth D3 may be between about 1 nm and about 10 nm, such as about 5 nm. As shown in FIG. 27B, the second implantation process 124B increase the size of the first expanded regions 130A to form second expanded regions 130B that further seal the air gaps 120. The second expanded regions 130B are larger than the first expanded regions 130A, and seal the air gaps 120 more completely than the first expanded regions 130A. Due to the presence of the first expanded regions 130A, the dopants implanted by the second implantation process 124B are blocked from migrating into the air gaps 120. Thus, dopants from the second implantation process 124B are blocked from reaching the dopant regions 128. In some cases, the dopant regions 128 formed by the total two-step implantation process 124A-B may be less than those formed by the implantation process 124 described above in FIG. 23 or FIG. 26. In this manner, unwanted effects due to the dopant regions 128 may be reduced or eliminated by using a two-step implantation process 124A-B as described herein.

Figure 29:
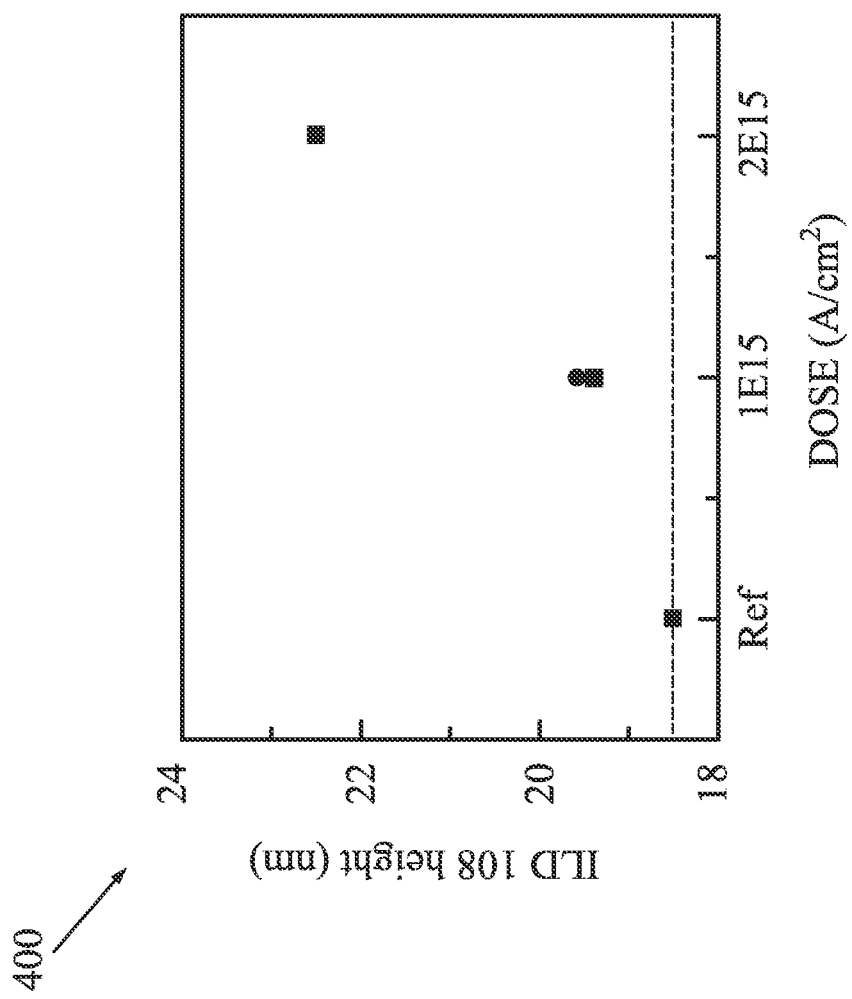
FIG. 29 shows experimental data of measured thicknesses of an interlayer dielectric without an overlying capping layer, in accordance with some embodiments.

Turning to FIGS. 28 and 29, an embodiment is shown in which the implantation process 124 is performed prior to formation of the capping layer 122. As shown in FIG. 28, without the constraint on vertical expansion provided by a capping layer 122, the implantation process 124 causes the second ILD 108 to expand both laterally and vertically. In addition to the lateral expansion that forms the expanded regions 130, the vertical expansion causes the thickness of the second ILD 108 to increase. In some embodiments, the thickness of the second ILD 108 may increase by a distance D4 that is between about 0.5 nm and about 3 nm. For example, FIG. 29 shows experimental data 400 of measured thicknesses of the second ILD 108 without an overlying capping layer 122. The data 400 shows the thickness of the second ILD prior to the implantation process 124 and after the implantation process 124 has been performed. The point indicated at "Ref" shows the thickness of a second ILD 108 prior to the implantation process 124, and the remaining points show the thickness of a second ILD 108 after the implantation process 124 using two different implantation doses. As shown in FIG. 29, without an overlying capping layer 122, thickness of the second ILD 108 increases due to vertical expansion. The data 400 also shows that a higher implantation dose can cause greater vertical expansion of the second ILD 108.

Figure 30B:
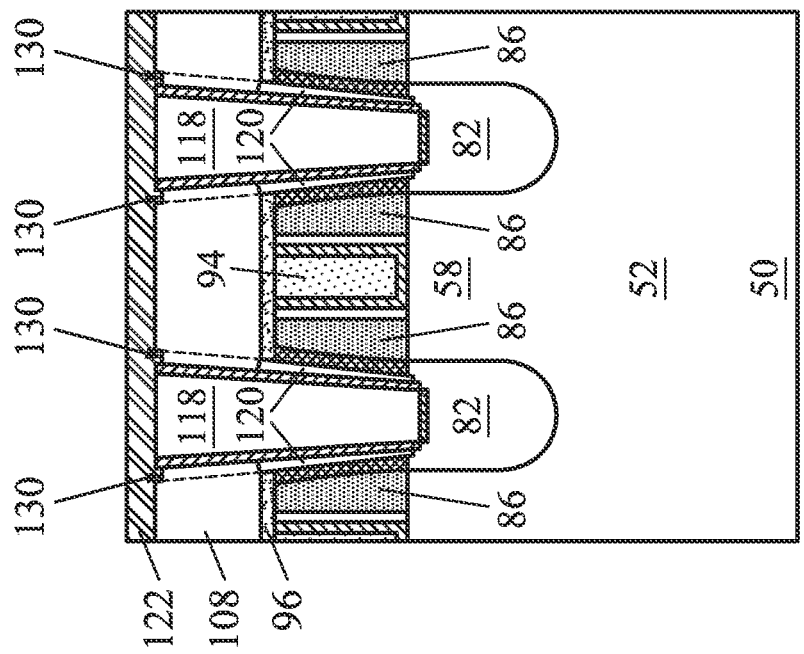
FIGS. 30A, 30B, 31A, 31B, 32A, 32B, 33A, and 33B are cross-sectional views of intermediate stages in the manufacturing of FinFETs having air gaps, in accordance with some embodiments.
Figure 30A:
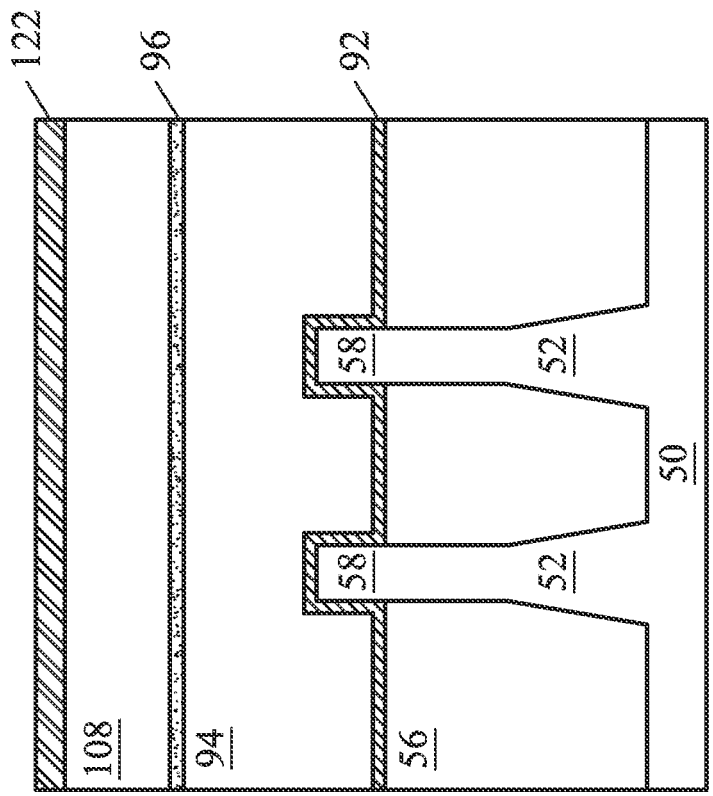

FIGS. 30A through 32B are cross-sectional views of additional stages in the manufacturing of FinFETs, in accordance with some embodiments. FIGS. 30A through 32B show the same cross-sectional views of the structure shown in FIGS. 14A and 14B. FIGS. 30A and 30B show the structure after expanded regions 130 have been formed, such as after the implantation process 124 described in FIG. 26 or after the two-step implantation process 124A-B described in FIGS. 27A and 27B has been performed.

Figure 31B:
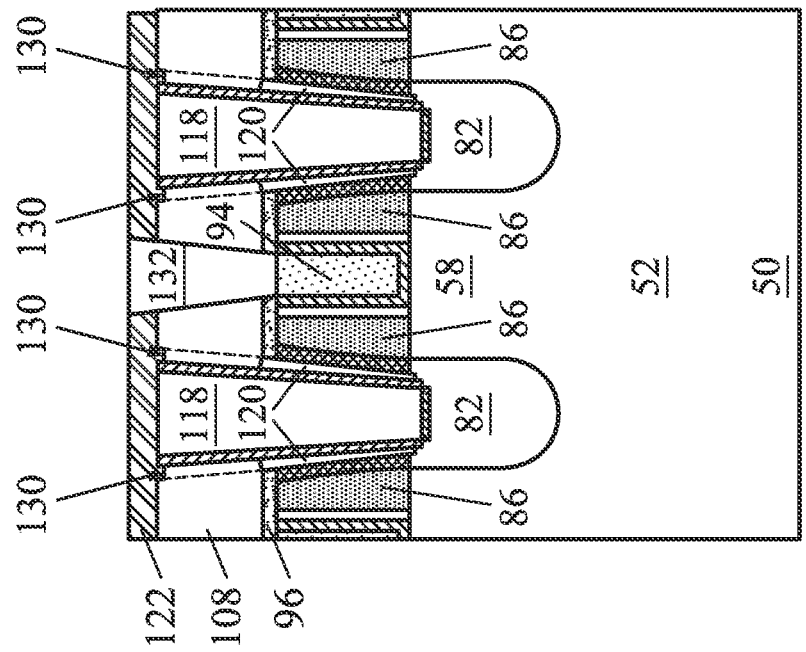
Figure 31A:
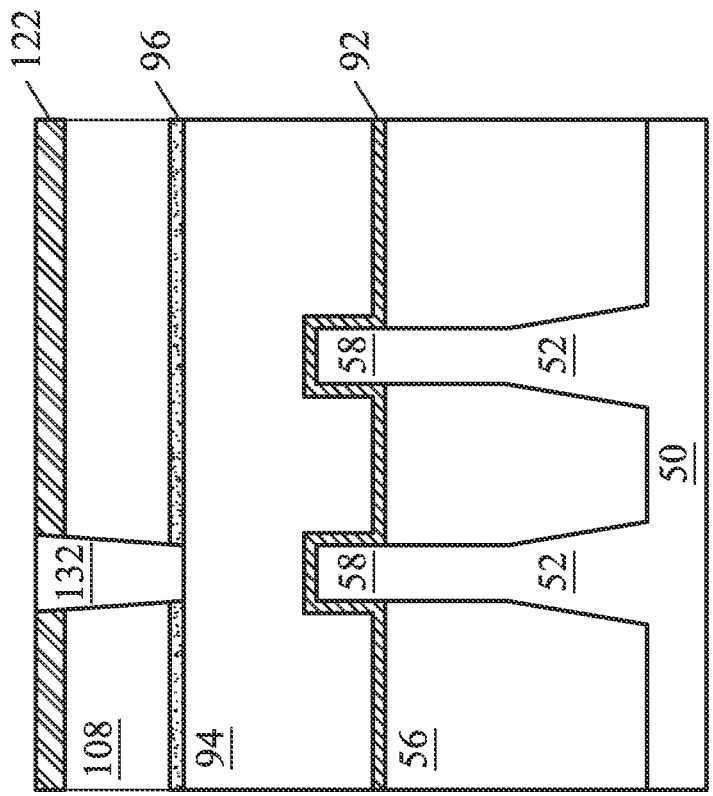

In FIGS. 31A and 31B, gate contacts 132 are formed through the capping layer 122, the second ILD 108, and the hard mask 96. Openings for the gate contacts 132 may first be formed through the capping layer 122, the second ILD 108, and the hard mask 96. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, the like, or a combination thereof. The conductive material may be copper, a copper alloy, silver, gold, tungsten, cobalt, aluminum, nickel, the like, or a combination thereof. A planarization process, such as a CMP, may be performed to remove excess material from a surface of the capping layer 122. The remaining liner and conductive material form the gate contacts 132 in the openings. The gate contacts 132 are physically and electrically coupled to the gate electrodes 94. The source/drain contacts 118 and gate contacts 132 may be formed in different processes, or may be formed in the same process. Although shown as being formed in the same cross-sections, it should be appreciated that each of the source/drain contacts 118 and gate contacts 132 may be formed in different cross-sections, which may avoid shorting of the contacts.

Figure 32A:
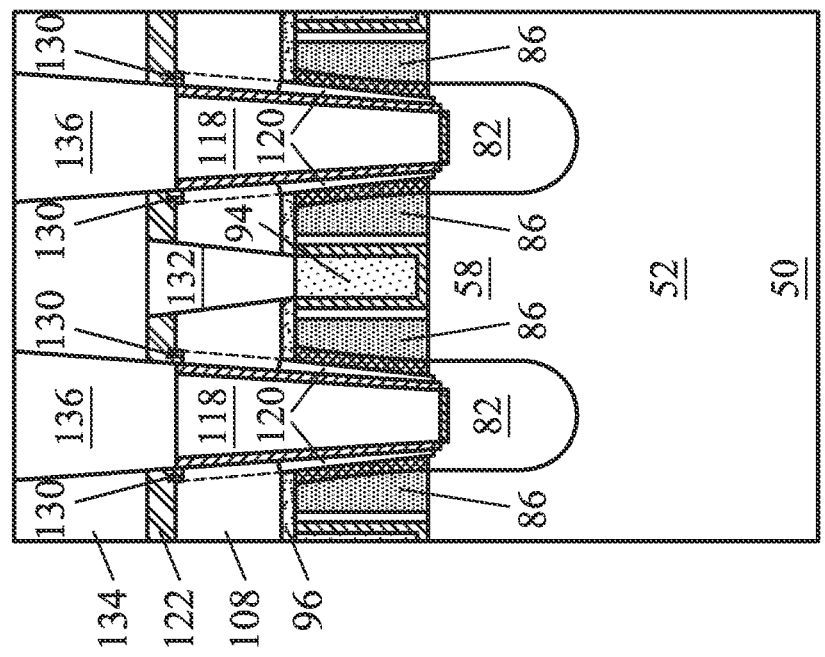
Figure 32B:
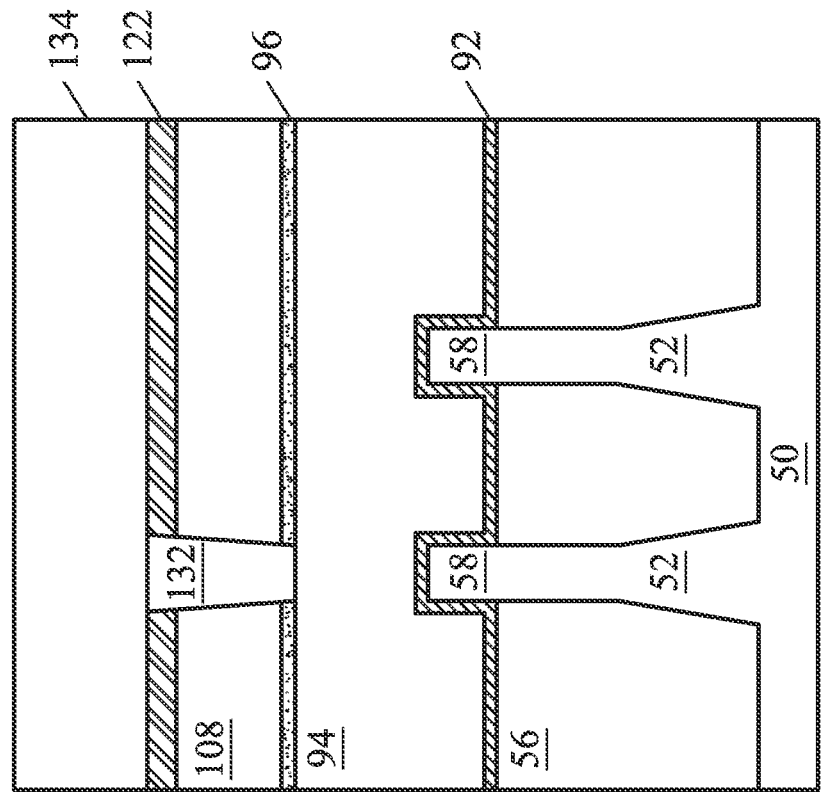

In FIGS. 32A and 32B, conductive features 136 are formed to contact the source/drain contacts 118, in accordance with some embodiments. The conductive features 136 may include one or more metal lines and/or vias that make physical and electrical contact with the source/drain contacts 118. In some embodiments, some conductive features 136 may also be formed that contact the gate contacts 132 (not shown in FIGS. 32A and 32B). The conductive features 136 may be, for example, redistribution layers. The conductive features 136 may be formed using any suitable technique.

In some embodiments, a dielectric layer 134 may first be formed over the capping layer 122 and the conductive features 136 formed within the dielectric layer 134. The dielectric layer 134 may be formed from a suitable dielectric material such as a low-k dielectric material, a polymer such as a polyimide, a silicon oxide, a silicon nitride, silicon carbide, silicon carbonitride, silicon oxycarbonitride, the like, or a combination thereof. The dielectric layer 134 may be formed using a suitable process such as spin-on coating, CVD, PVD, ALD, or the like. Openings for the conductive features 136 (not shown) may then be formed through the dielectric layer 134 and the capping layer 122 to expose the source/drain contacts 118. The openings may be formed using acceptable photolithography and etching techniques. In some cases, the use of the expanded regions 130 to seal the air gaps 120 may prevent the air gaps 120 from being exposed when the openings are formed. For example, the openings may be formed extending over the air gaps 120 due to e.g. photolithographic misalignment. In this manner, subsequently deposited material is blocked from entering the air gaps 120.

In some embodiments, the material of the conductive features 136 may be formed using a single and/or a dual damascene process, a via-first process, or a metal-first process. A liner, such as a diffusion barrier layer, an adhesion layer, or the like, and a conductive material are formed in the openings. The liner may include titanium, titanium nitride, tantalum, tantalum nitride, or the like, which may be formed using a deposition process such as CVD, ALD, or the like. The conductive material may be copper, a copper alloy, silver, gold, tungsten, cobalt, aluminum, nickel, the like, or a combination thereof. The conductive material may be formed over the diffusion barrier layers in the openings by an electro-chemical plating process, CVD, ALD, PVD, the like, or a combination thereof. The material of the liner and/or the conductive material is blocked from entering the air gaps 120 by the expanded regions 130. A planarization process, such as a CMP, may be performed to remove excess material from a surface of the dielectric layer 134. The remaining liner and conductive material form the conductive features 136. The conductive features 136 may be formed using other techniques in other embodiments.

Figure 33B:
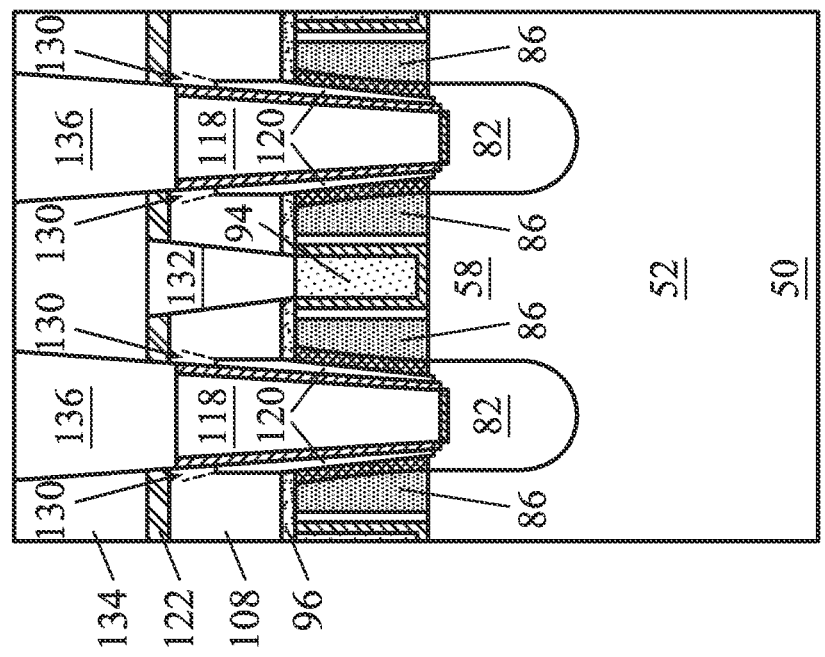
Figure 33A:
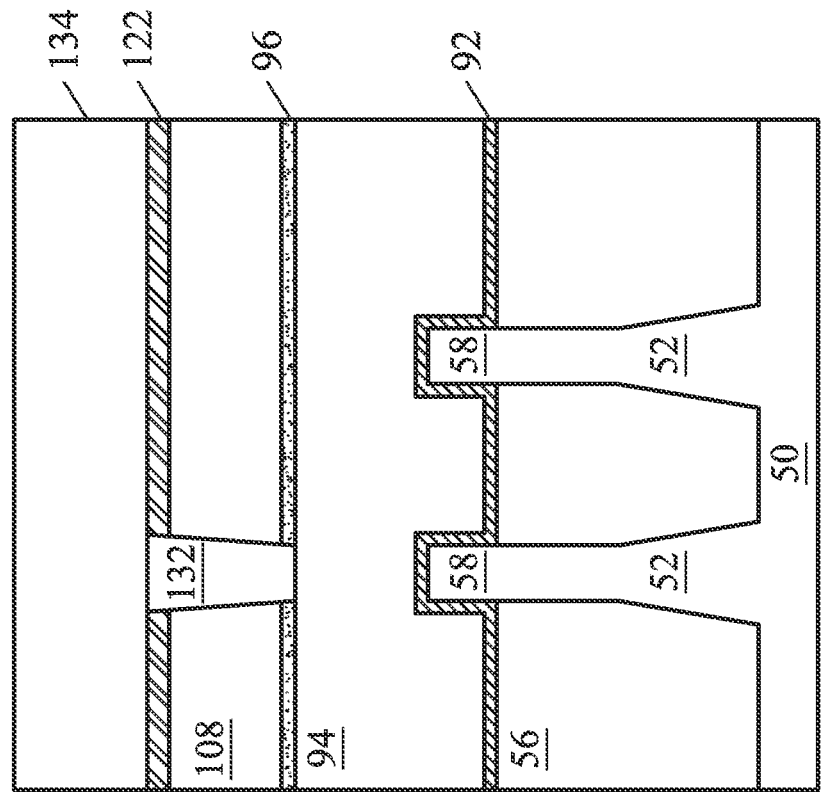

FIGS. 33A and 33B illustrate the formation of conductive features 136 for an embodiment in which the implantation process 124 was performed prior to formation of the capping layer 122. The embodiment shown in FIGS. 33A-B is similar to the embodiment described previously for FIGS. 28 and 29. As shown in FIGS. 33A-B, without the constraint on vertical expansion provided by a capping layer 122, the implantation process 124 causes the thickness of the second ILD 108 to increase. The planarity of the second ILD 108 may also be reduced. The conductive features 136 are formed to contact the source/drain contacts 118, and may be similar to the conductive features described above for FIGS. 32A-B.

Embodiments may achieve advantages. By forming air gaps between the source/drain contacts and the gate stack of a FinFET device, capacitance between the source/drain contacts and the gate stack may be reduced. Reducing this capacitance can improve the speed or high-frequency operation of the FinFET device. Additionally, the top of the air gaps are sealed by implanting an inter-layer dielectric layer (ILD) with dopants. The implanted dopants cause the ILD to expand and extend across the air gaps, sealing the air gaps. By sealing the air gaps, unwanted material can be blocked from entering the air gaps and degrading device performance or causing process defects. In some cases, the use of two separate implantation steps can reduce the amount of implanted dopants near the channel region of the FinFET device. Additionally, by forming a capping layer prior to implanting the dopants, vertical expansion of the ILD can be suppressed, resulting in a more uniform top surface.

In some embodiments, a device includes a fin extending from a semiconductor substrate; a gate stack over the fin; a first spacer on a sidewall of the gate stack; a source/drain region in the fin adjacent the first spacer; an inter-layer dielectric layer (ILD) extending over the gate stack, the first spacer, and the source/drain region, the ILD having a first portion and a second portion, wherein the second portion of the ILD is closer to the gate stack than the first portion of the ILD; a contact plug extending through the ILD and contacting the source/drain region; a second spacer on a sidewall of the contact plug; and an air gap between the first spacer and the second spacer, wherein the first portion of the ILD extends across the air gap and physically contacts the second spacer, wherein the first portion of the ILD seals the air gap. In an embodiment, the ILD has a first thickness, and wherein the first portion of the ILD has a second thickness that is between 10% and 105% of the first thickness. In an embodiment, the device includes an etch stop layer on the gate stack and on the first spacer, wherein a portion of the etch stop layer is exposed to the air gap. In an embodiment, wherein the first portion of the ILD has a first concentration of dopants, and wherein the second portion of the ILD has a second concentration of dopants that is less than the first concentration. In an embodiment, the dopants include Ge, Ar, Si, or Xe. In an embodiment, the second spacer extends closer to the semiconductor substrate than the air gap. In an embodiment, the contact plug extends closer to the semiconductor substrate than the air gap. In an embodiment, the second spacer includes silicon nitride. In an embodiment, the device includes a capping layer on the ILD. In an embodiment, a first region of the capping layer on the first portion of the ILD extends closer to the semiconductor substrate than a second region of the capping layer on the second portion of the ILD.

In some embodiments, a semiconductor device includes a fin protruding from a substrate; a gate structure over a channel region of the fin; an epitaxial region in the fin adjacent the channel region; a first dielectric layer over the gate structure, the first dielectric layer including a first region that is doped with a first dopant; a contact plug extending through the first dielectric layer and contacting the epitaxial region; a second dielectric layer over the first dielectric layer; and an air gap between the contact plug and the gate structure, wherein an upper region of the air gap is bounded by the first region, and wherein the air gap is separated from the second dielectric layer by the first region. In an embodiment, a lower region of the air gap is bounded by the epitaxial region. In an embodiment, a region of the epitaxial region adjacent the air gap is doped with the first dopant. In an embodiment, the maximum concentration of the first dopant within the first region is between 1 nm and 5 nm below a top surface of the first dielectric layer. In an embodiment, the first region has a concentration of the first dopant that is between $10^{19}$ cm$^{-3}$ and $10^{22}$ cm$^{-3}$. In an embodiment, a portion of the second dielectric layer protrudes into the first region.

In some embodiments, a method includes forming a gate stack over a semiconductor fin; forming an epitaxial source/drain region in the semiconductor fin adjacent the gate stack; depositing a first dielectric layer over the gate stack and over the epitaxial source/drain region; forming an opening in the first dielectric layer to expose the epitaxial source/drain region; depositing a sacrificial material within the opening; depositing a conductive material over the sacrificial material within the opening; removing the sacrificial material to form a recess; and implanting the first dielectric layer with a dopant, wherein after implanting the first dielectric layer the recess is covered by the first dielectric layer. In an embodiment, the sacrificial material is silicon. In an embodiment, the method includes depositing a second dielectric layer on the sacrificial material within the opening. In an embodiment, the method includes depositing a third dielectric layer over the first dielectric layer before implanting the first dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
a fin extending from a semiconductor substrate;
a gate stack over the fin;
a first spacer on a sidewall of the gate stack;
a source/drain region in the fin adjacent the first spacer;
an inter-layer dielectric layer (ILD) extending over the gate stack, the first spacer, and the source/drain region, the ILD comprising a first portion and a second portion, wherein the second portion of the ILD is closer to the gate stack than the first portion of the ILD, wherein the ILD is free of physical contact with the first spacer;
a contact plug extending through the ILD and contacting the source/drain region;
a second spacer on a sidewall of the contact plug, wherein the second spacer extends farther from the semiconductor substrate than the first spacer; and
an air gap between the first spacer and the second spacer, wherein the first portion of the ILD extends across the air gap and physically contacts the second spacer, wherein the first portion of the ILD seals the air gap.

2. The device of claim 1, wherein the ILD has a first thickness, and wherein the first portion of the ILD has a second thickness that is between 10% and 105% of the first thickness.

3. The device of claim 1, further comprising an etch stop layer on the gate stack and on the first spacer, wherein a portion of the etch stop layer is exposed to the air gap.

4. The device of claim 1, wherein the first portion of the ILD has a first concentration of dopants, and wherein the second portion of the ILD has a second concentration of dopants that is less than the first concentration.

5. The device of claim 4, wherein the dopants comprise Ge, Ar, Si, or Xe.

6. The device of claim 1, wherein the second spacer extends closer to the semiconductor substrate than the air gap.

7. The device of claim 1, wherein the contact plug extends closer to the semiconductor substrate than the air gap.

8. The device of claim 1, wherein the second spacer comprises silicon nitride.

9. The device of claim 1, further comprising a capping layer on the ILD.

10. The device of claim 9, wherein a first region of the capping layer on the first portion of the ILD extends closer to the semiconductor substrate than a second region of the capping layer on the second portion of the ILD.

11. A semiconductor device comprising:
a fin protruding from a substrate;
a gate structure over a channel region of the fin;
an epitaxial region in the fin adjacent the channel region;
a first dielectric layer over the gate structure, the first dielectric layer comprising a first region that is doped with a first dopant;
a contact plug extending through the first dielectric layer and contacting the epitaxial region;
a second dielectric layer over the first dielectric layer; and
an air gap between the contact plug and the gate structure, wherein an upper region of the air gap is bounded by the first region, and wherein the air gap is separated from the second dielectric layer by the first region.

12. The semiconductor device of claim 11, wherein a lower region of the air gap is bounded by the epitaxial region.

13. The semiconductor device of claim 11, wherein a region of the epitaxial region adjacent the air gap is doped with the first dopant.

14. The semiconductor device of claim 11, wherein the maximum concentration of the first dopant within the first region is between 1 nm and 5 nm below a top surface of the first dielectric layer.

15. The semiconductor device of claim 11, wherein the first region comprises a concentration of the first dopant that is between $10^{19}$ cm$^{-3}$ and $10^{22}$ cm$^{-3}$.

16. The semiconductor device of claim 11, wherein a portion of the second dielectric layer protrudes into the first region.

17. A device comprising:
a contact plug over a substrate;
a spacer adjacent the contact plug, wherein the spacer is isolated from the contact plug by an air gap that extends between a sidewall of the contact plug and a sidewall of the spacer;
an insulating layer covering the air gap and the spacer, wherein the insulating layer extends along the sidewall of the contact plug, wherein the insulating layer comprises a doped region, wherein a top surface of the insulating layer and a top surface of the contact plug are level; and
a capping layer over the contact plug and the insulating layer, wherein a bottom surface of the capping layer is below the top surface of the insulating layer.

18. The device of claim 17 further comprising a dielectric layer extending between the spacer and the insulating layer, wherein the air gap extends farther from the substrate than a top surface of the dielectric layer.

19. The device of claim 17, wherein the insulating layer extends a first vertical distance along the sidewall of the contact plug, wherein the first vertical distance is less than the thickness of the insulating layer directly over the spacer.

20. The device of claim 17, wherein the air gap extends closer to the substrate than a bottom surface of the spacer.

* * * * *